US011226662B2

(12) United States Patent
Miyamoto et al.

(10) Patent No.: US 11,226,662 B2
(45) Date of Patent: Jan. 18, 2022

(54) MANAGEMENT DEVICE, MANAGEMENT METHOD, AND NON-TRANSITORY PROGRAM RECORDING MEDIUM

(71) Applicant: NEC CORPORATION, Tokyo (JP)

(72) Inventors: Yoshinori Miyamoto, Tokyo (JP); Manussanun Buranachokphaisan, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 300 days.

(21) Appl. No.: 16/498,131

(22) PCT Filed: Mar. 29, 2017

(86) PCT No.: PCT/JP2017/012978
§ 371 (c)(1),
(2) Date: Sep. 26, 2019

(87) PCT Pub. No.: WO2018/179158
PCT Pub. Date: Oct. 4, 2018

(65) Prior Publication Data
US 2021/0278884 A1    Sep. 9, 2021

(51) Int. Cl.
*F25J 1/00*   (2006.01)
*G06F 1/20*   (2006.01)
*G05B 19/4155*   (2006.01)

(52) U.S. Cl.
CPC ........... *G06F 1/20* (2013.01); *G05B 19/4155* (2013.01); *G05B 2219/49216* (2013.01); *G05B 2219/49219* (2013.01)

(58) Field of Classification Search
CPC ................. G06F 1/20; G05B 19/4155; G05B 2219/49216; G05B 2219/49219
(Continued)

(56) References Cited

U.S. PATENT DOCUMENTS 6,205,799 B1 *   3/2001   Patel .................. H01L 23/4735
62/132
6,955,062 B2 *   10/2005   Tilton ...................... F28D 5/00
257/E23.1
(Continued)

FOREIGN PATENT DOCUMENTS

JP   2004-169942 A   6/2004
JP   2011-196657 A   10/2011
(Continued)

OTHER PUBLICATIONS

International Search Report of PCT/JP2017/012978 dated May 16, 2017 [PCT/ISA/210].
(Continued)

*Primary Examiner* — Claire E Rojohn, III
(74) *Attorney, Agent, or Firm* — Sughrue Mion, PLLC

(57) ABSTRACT

A management device includes: storage unit which stores a known intake air temperature of a heating element, and a heat transfer characteristic of a cooling device; heat extraction amount calculation unit which calculates a heat extraction amount of the cooling device, by use of the refrigerant information input by the input means, and a cooling capacity of the refrigerant; and air volume calculation unit which calculates an air volume of air supplied to the cooling device, by applying the heat extraction amount to air volume dependence of the heat extraction amount, being derived by use of air volume dependence of a difference temperature between a temperature of the refrigerant and a temperature of exhaust air from the heating element, and the heat transfer characteristic, the air volume dependence of the difference temperature being derived by use of the intake air temperature, the power consumption, and the refrigerant information.

19 Claims, 27 Drawing Sheets

(58) Field of Classification Search
USPC .......................................................... 62/615
See application file for complete search history.

(56) References Cited

U.S. PATENT DOCUMENTS

| | | | | |
|---|---|---|---|---|
| 7,000,691 | B1* | 2/2006 | Weber | F25B 23/006 165/201 |
| 7,180,741 | B1* | 2/2007 | Knight | H05K 7/20345 165/80.4 |
| 7,405,935 | B1* | 7/2008 | Carey | H05K 7/20345 361/699 |
| 7,864,527 | B1* | 1/2011 | Whitted | H05K 7/20781 361/696 |
| 7,916,483 | B2* | 3/2011 | Campbell | H05K 7/20236 361/702 |
| 7,961,475 | B2* | 6/2011 | Campbell | H05K 7/20772 361/748 |
| 8,174,828 | B2* | 5/2012 | Tilton | H05K 7/20345 361/689 |
| 8,179,677 | B2* | 5/2012 | Campbell | H05K 7/203 361/699 |
| 8,184,436 | B2* | 5/2012 | Campbell | H05K 7/20809 361/700 |
| 8,351,206 | B2* | 1/2013 | Campbell | H05K 7/20809 361/700 |
| 8,382,565 | B2* | 2/2013 | Dawson | H05K 7/20836 454/239 |
| 8,724,322 | B2* | 5/2014 | Rinke | H05K 7/20772 361/699 |
| 9,386,727 | B2* | 7/2016 | Barringer | H05K 7/20709 |
| 9,459,017 | B2* | 10/2016 | Liu | F24F 5/0035 |
| 9,529,395 | B2* | 12/2016 | Franz | H05K 7/20772 |
| 10,653,043 | B2* | 5/2020 | Enright | H05K 7/20318 |
| 10,722,824 | B2* | 7/2020 | Roca | B01D 21/245 |
| 10,966,353 | B2* | 3/2021 | Wang | H05K 5/06 |
| 11,032,949 | B2* | 6/2021 | Gao | H05K 7/20254 |
| 2004/0240514 | A1* | 12/2004 | Bash | H05K 7/20836 374/109 |
| 2004/0264124 | A1* | 12/2004 | Patel | G06F 1/20 361/679.46 |
| 2005/0207116 | A1* | 9/2005 | Yatskov | H05K 7/2079 361/690 |
| 2005/0228618 | A1* | 10/2005 | Patel | G06F 9/505 702/188 |
| 2006/0126296 | A1* | 6/2006 | Campbell | H05K 7/20781 361/700 |
| 2007/0034360 | A1* | 2/2007 | Hall | H05K 7/20418 165/104.33 |
| 2007/0193300 | A1* | 8/2007 | Tilton | H01L 23/427 62/475 |
| 2007/0201210 | A1* | 8/2007 | Chow | H05K 7/20772 361/704 |
| 2007/0227710 | A1* | 10/2007 | Belady | H05K 7/2079 165/122 |
| 2007/0291452 | A1* | 12/2007 | Gilliland | H05K 7/20781 361/699 |
| 2008/0158818 | A1* | 7/2008 | Clidaras | H05K 7/20772 361/699 |
| 2008/0196868 | A1* | 8/2008 | Attlesey | G06F 1/181 165/104.33 |
| 2009/0080173 | A1* | 3/2009 | Porter | H05K 7/20827 361/831 |
| 2009/0086428 | A1* | 4/2009 | Campbell | H05K 7/2079 361/694 |
| 2009/0086432 | A1* | 4/2009 | Campbell | H05K 7/20754 361/696 |
| 2009/0133866 | A1* | 5/2009 | Campbell | G06F 1/20 165/288 |
| 2009/0156114 | A1* | 6/2009 | Ahladas | H05K 7/20736 454/184 |
| 2009/0238235 | A1* | 9/2009 | Campbell | H05K 7/20772 374/5 |
| 2009/0260777 | A1* | 10/2009 | Attlesey | H05K 7/20772 165/67 |
| 2009/0268404 | A1* | 10/2009 | Chu | H05K 7/20836 361/696 |
| 2009/0316360 | A1* | 12/2009 | Campbell | H01L 23/4735 361/699 |
| 2010/0101765 | A1* | 4/2010 | Campbell | H05K 7/20809 165/104.33 |
| 2010/0103618 | A1* | 4/2010 | Campbell | H05K 7/20236 361/699 |
| 2011/0083824 | A1* | 4/2011 | Rogers | H05K 7/20554 165/80.2 |
| 2011/0195652 | A1* | 8/2011 | Smith | H05K 7/20736 454/184 |
| 2011/0253347 | A1* | 10/2011 | Harrington | F28F 7/02 165/104.31 |
| 2012/0168119 | A1* | 7/2012 | Dunnavant | H05K 7/20745 165/59 |
| 2012/0180979 | A1* | 7/2012 | Harrington | H05K 7/20281 165/11.1 |
| 2016/0120072 | A1* | 4/2016 | Boegner | G05D 13/62 165/247 |
| 2019/0293356 | A1* | 9/2019 | Tian | F25B 23/006 |
| 2021/0278098 | A1* | 9/2021 | Quazi | F24F 11/63 |

FOREIGN PATENT DOCUMENTS

| | | |
|---|---|---|
| JP | 2011-220665 A | 11/2011 |
| JP | 2013-175069 A | 9/2013 |
| JP | 5897319 B2 | 3/2016 |
| JP | 5949048 B2 | 7/2016 |

OTHER PUBLICATIONS

Written Opinion of PCT/JP2017/012978 dated May 16, 2017 [PCT/ISA/237].

* cited by examiner

US 11,226,662 B2

MANAGEMENT DEVICE, MANAGEMENT METHOD, AND NON-TRANSITORY PROGRAM RECORDING MEDIUM

CROSS REFERENCE TO RELATED APPLICATIONS

This application is a National Stage of International Application No. PCT/JP2017/012978, filed Mar. 29, 2017.

TECHNICAL FIELD

The present invention relates to a management device which manages a cooling system, a management method, and a program recording medium.

BACKGROUND ART

In a data center where many computers are placed in a room, an air conditioning device for adjusting a room temperature is provided such way that heat generated by running of a computer is not kept in. For example, there is adopted a scheme of improving heat efficiency by a layout in which a cold aisle is formed on an intake side at a front surface of a rack where computers are stacked, and a hot aisle is formed on an exhaust side at a back surface of the rack.

PTL 1 discloses a self-standing wall type exhaust cooling unit which cools exhaust air of electronic instruments such as servers by a group of electronic instruments in order to remove heat from the electronic instruments. The unit of PTL 1 includes a wind block means which is disposed with intervals from a back surface side of a server rack, and which blocks outflow of exhaust air flowing into an exhaust air flow region formed between the wind block means and the server rack.

PTL 2 discloses an air conditioning control system which controls an air volume balance in an air-conditioned facility. The system of PTL 2 controls an air volume of an air conditioner, based on power consumption of an instrument disposed in each divisional region of the air-conditioned facility, and power consumption of the air conditioner. Moreover, the system of PTL 2 includes first air volume control means for uniformly decreasing air volumes of a plurality of air conditioners, second air volume control means for decreasing air volumes of a predetermined number of air conditioners selected from the plurality of air conditioners, and third air volume control means for performing trial control of air conditioning, based on a preset condition.

CITATION LIST

Patent Literature

[PTL 1] Japanese Patent No. 5897319
[PTL 2] Japanese Patent No. 5949048

SUMMARY OF INVENTION

Technical Problem

According to PTL 1, cold air taken into a server rack and hot air discharged from the server rack can be separated, and therefore, a ceiling height needed for a general hot aisle/cold aisle scheme is not needed. Additionally, PTL 1 also suggests a fan for guiding exhaust heat of a server into a cooling unit such that the air volume to the server does not become insufficient. However, PTL 1 does not disclose a method of determining whether the air volume is excessive or insufficient, or a method of controlling a fan, and therefore has a problem that a specific operation method is unclear.

The system of PTL 2 places various measurement means for measuring an air volume, a wind direction, a temperature, and the like at a front and a back surfaces of a server rack, and controls a fan of an air conditioner, based on measurement values of the measurement means. However, the system of PTL 2 needs to increase sensors depending on a number of the server racks, and has a problem that labor for placement and maintenance of the sensor, and an introduction cost are increased.

An object of the present invention is to provide a management device which solves the above-described problems, and is able to calculate an air volume of air supplied to a cooling device without using an air volume sensor.

Solution to Problem

A management device in one aspect of the present invention includes: a storage unit for storing a known intake air temperature of a heating element, and a heat transfer characteristic of a cooling device being placed near the heating element and cooling exhaust air from the heating element; an input unit for inputting refrigerant information of a refrigerant used in the cooling device, and power consumption of the heating element; a heat extraction amount calculation unit for calculating a heat extraction amount of the cooling device, by use of the refrigerant information input by the input unit and a cooling capacity of the refrigerant; an air volume calculation unit for calculating an air volume of air supplied to the cooling device, by applying the heat extraction amount to air volume dependence of the heat extraction amount, being derived by use of air volume dependence of a difference temperature between a temperature of the refrigerant and a temperature of exhaust air from the heating element, and the heat transfer characteristic, the air volume dependence of the difference temperature being derived by use of the intake air temperature, the power consumption, and the refrigerant information; and an output unit for outputting data relating to an air volume calculated by the air volume calculation unit.

A management method in one aspect of the present invention includes: inputting refrigerant information of a refrigerant used in a cooling device, and power consumption of a heating element; calculating a heat extraction amount by use of the input refrigerant information and a cooling capacity of the refrigerant; deriving air volume dependence of the heat extraction amount of the cooling device by use of air volume dependence of a difference temperature between a temperature of the refrigerant and a temperature of exhaust air from the heating element, and a heat transfer characteristic of the cooling device, the air volume dependence of the difference temperature being derived by use of a known intake air temperature of the heating element, the power consumption, and the refrigerant information, the cooling device being placed near the heating element and cooling exhaust air from the heating element; calculating an air volume of air supplied to the cooling device by applying the heat extraction amount to the derived air volume dependence of the heat extraction amount; and outputting data relating to the calculated air volume.

A program recording medium in one aspect of the present invention records a program which causes a computer to execute: processing of inputting refrigerant information of a refrigerant used in a cooling device, and power consumption of a heating element; processing of calculating a heat extraction amount by use of the input refrigerant information and a cooling capacity of the refrigerant; processing of deriving air volume dependence of the heat extraction amount of the cooling device by use of air volume dependence of a difference temperature between a temperature of the refrigerant and a temperature of exhaust air from the heating element, and a heat transfer characteristic of the cooling device, the air volume dependence of the difference temperature being derived by use of a known intake air temperature of the heating element, the power consumption, and the refrigerant information, the cooling device being placed near the heating element and cooling exhaust air from the heating element; processing of calculating an air volume of air supplied to the cooling device by applying the heat extraction amount to the derived air volume dependence of the heat extraction amount; and processing of outputting data relating to the calculated air volume.

Advantageous Effects of Invention

The present invention enables to provide a management device which is able to calculate an air volume of air supplied to a cooling device without using an air volume sensor.

EXAMPLE EMBODIMENT

Figure 1:
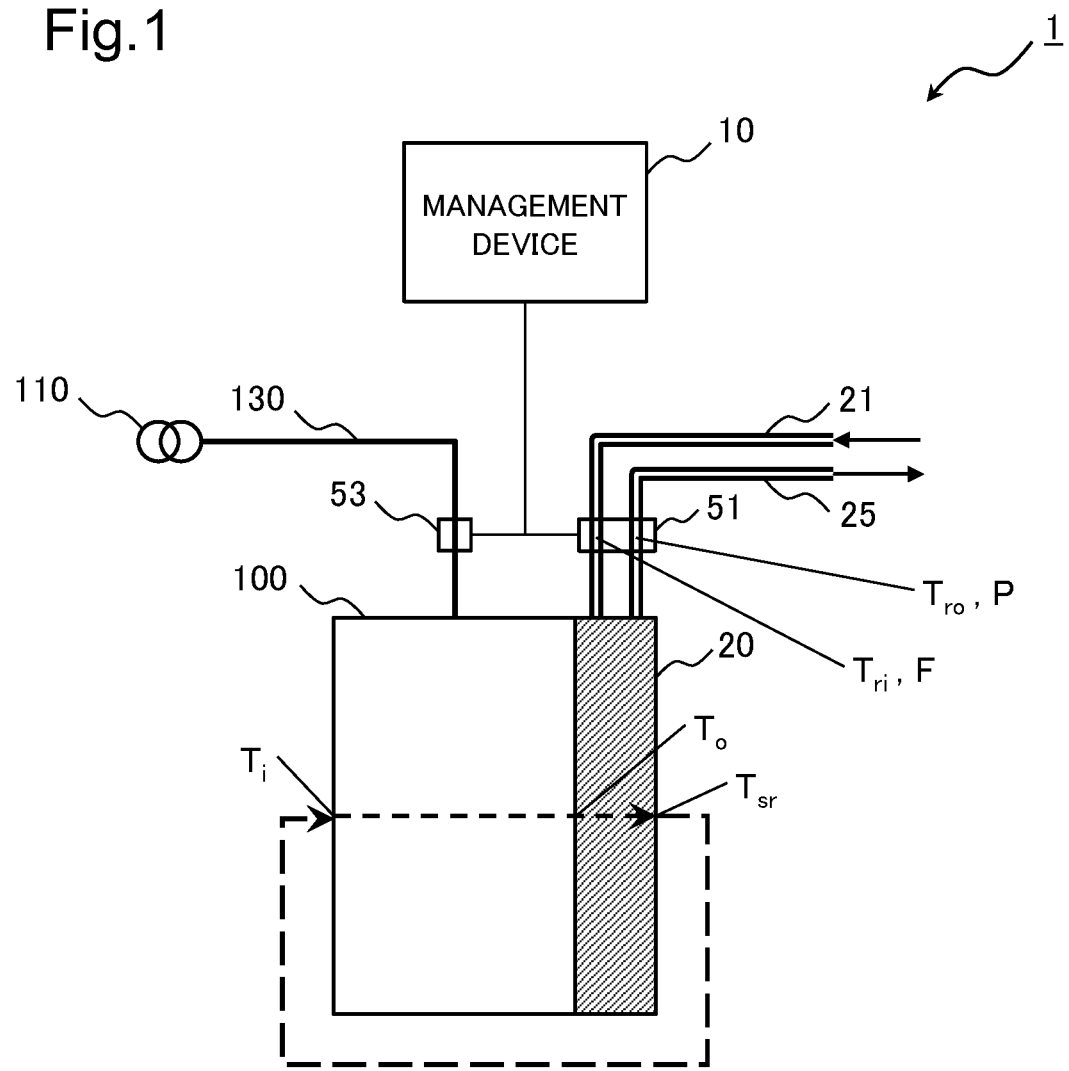
FIG. 1 is a block diagram illustrating a configuration of a cooling system according to a first example embodiment of the present invention.

Example embodiments of the present invention will be described below by use of the drawings. However, technically preferable limitation is given to the example embodiments described below in order to implement the present invention, but does not limit the scope of the invention to the following. Note that, unless there is particularly a reason, a same reference sign is assigned to a similar part in all the drawings used for the description of the example embodiments below. Moreover, in the example embodiments below, a repeated description may be omitted in relation to a similar configuration or operation. Further, a direction of an arrow in the drawings indicates one example of flow of a refrigerant or air, and does not limit a direction thereof.

First Example Embodiment

Configuration

First, a configuration of a cooling system according to a first example embodiment of the present invention is described with reference to the drawings. FIG. 1 is a block diagram illustrating a configuration of a cooling system 1 according to the present example embodiment. As in FIG. 1, the cooling system 1 according to the present example embodiment includes a management device 10 and a cooling device 20. A heating element 100 is a target to be cooled by the cooling system 1.

In the present example embodiment, a server rack housing at least one server is assumed as the heating element 100. In-room air is continuously guided into the heating element 100 by a non-illustrated fan placed inside the server or on the server rack. Air introduced into the heating element 100 is warmed by exchanging heat inside the heating element 100, and then discharged. Hereinafter, air introduced into the heating element 100 is referred to as intake air, and air discharged from the heating element 100 is referred to as exhaust air. In the present example embodiment, exhaust air discharged from the heating element 100 is supplied to the cooling device 20, and air (cool air) cooled to a predetermined temperature (also referred to as a set temperature) in the cooling device 20 is discharged into a room. In the present example embodiment, a set temperature is set as a known intake air temperature of the heating element 100. Note that a sensing value acquired by a temperature sensor placed on an intake side of the heating element 100 may be used as a known intake air temperature.

The present example embodiment includes a pipe (not illustrated) for supplying and discharging fluid (hereinafter, a refrigerant) for cooling air supplied into the cooling device 20. A liquid refrigerant (hereinafter, a liquid-phase refrigerant) is supplied to a pipe inside the cooling device 20. A liquid-phase refrigerant circulating inside the pipe is vaporized by exchanging heat with exhaust air of a heating element and thus being warmed, and discharged as a gas refrigerant (hereinafter, a gas-phase refrigerant). Note that, although the present example embodiment assumes use of a phase-change cooling which cools by utilizing absorbed heat when a refrigerant circulating inside the pipe of the cooling device 20 phase-changes from a liquid phase to a gas phase, a refrigerant circulating inside a pipe does not necessarily have to phase-change. For example, liquid such as liquid-phase water or oil may be circulated inside the pipe of the cooling device 20 without phase-changing the liquid.

The management device 10 acquires refrigerant information including information such as a temperature, a flow volume, and pressure of a refrigerant circulating inside the pipe of the cooling device 20, and power consumption of the heating element 100. The management device 10 calculates an air volume of exhaust air discharged toward the cooling device 20 from the heating element 100, by use of the acquired information.

The management device 10 is connected to a refrigerant information acquisition device 51 which measures refrigerant information. The management device 10 acquires, from the refrigerant information acquisition device 51, a temperature (a supplied refrigerant temperature $T_{ri}$) and a flow volume (a supplied refrigerant flow volume F) of a liquid-phase cooling medium (hereinafter, a liquid-phase refrigerant) supplied to the pipe of the cooling device 20. Moreover, the management device 10 acquires, from the refrigerant information acquisition device 51, a temperature (a discharged refrigerant temperature $T_{ro}$) and pressure (discharged refrigerant pressure p) of a gas-phase cooling medium (hereinafter, a gas-phase refrigerant) guided out of the pipe of the cooling device 20.

Furthermore, the management device 10 is connected to a power measurement instrument 53 which measures power consumption P supplied to the heating element 100. The management device 10 acquires, from the power measurement instrument 53, the power consumption P supplied to the heating element 100.

The management device 10 calculates an air volume of air supplied to the cooling device 20, by use of data acquired from the refrigerant information acquisition device 51 and the power measurement instrument 53. In the present example embodiment, an air volume is a volume of air supplied to the cooling device 20 per unit time. Note that, in the present example embodiment, an air volume of exhaust air discharged toward the cooling device 20 from the heating element 100 is considered to be the same as an air volume of cool air released toward inside of a room from the cooling device 20.

The cooling device 20 is disposed near the heating element 100, and at a position where exhaust air from the heating element 100 passes. In other words, the cooling device 20 is disposed on an exhaust side of the heating element 100. The cooling device 20 may be disposed in such a way as to be in contact with the heating element 100, or may be disposed with intervals from the heating element 100. For example, the heating element 100 is a server rack having a cabinet on which a server is disposed. Moreover, when placed on a rear door of the server rack, the cooling device 20 is also referred to as a rear door type cooling device.

The cooling device 20 cools air warmed by passing inside the heating element 100. In the present example embodiment, it is assumed that, by releasing air cooled by the heating element 100, a temperature in a room is adjusted to a set temperature (hereinafter, a cooling set temperature $T_{sr}$), and intake air at the cooling set temperature $T_{sr}$ is supplied to the heating element 100. In other words, an intake air temperature $T_i$ of the heating element 100 is considered to be equal to the cooling set temperature $T_{sr}$.

A pipe (not illustrated) in which a refrigerant flows is housed inside the cooling device 20. The pipe inside the cooling device 20 preferably has a structure which facilitates heat exchange by zigzagging or branching the pipe or winding a fin around the pipe, and thus enlarging a surface area for contacting air. The cooling device 20 adjusts exhaust air at an exhaust air temperature $T_o$ discharged from the heating element 100 to the predetermined cooling set temperature $T_{sr}$, and then releases the adjusted exhaust air.

One end of the pipe of the cooling device 20 is connected to a supply pipe 21 for supplying a liquid-phase refrigerant. On the other hand, another end of the pipe of the cooling device 20 is connected to a discharge pipe 25 for discharging a gas-phase refrigerant. The supply pipe 21 and the discharge pipe 25 are connected to a non-illustrated heat exchange unit. A refrigerant cooled in the non-illustrated heat exchange unit is supplied to the supply pipe 21. Moreover, a refrigerant warmed by exchanging heat with exhaust air of the heating element 100 circulates in the discharge pipe 25. The refrigerant circulating inside the discharge pipe 25 is cooled in the non-illustrated heat exchange unit, and then supplied to the supply pipe 21. A liquid-phase refrigerant circulating inside the pipe of the cooling device 20 is warmed by exchanging heat with air passing inside the cooling device 20, before phase-changing and then circulating in a state in which a liquid phase and a gas phase are mixed. A refrigerant circulating inside the pipe of the cooling device 20 is vaporized by evaporation latent heat and therefore goes through isobaric change.

The refrigerant information acquisition device 51 is disposed in the supply pipe 21 and the discharge pipe 25. The refrigerant information acquisition device 51 measures a temperature (also referred to as the supplied refrigerant temperature $T_{ri}$) and a flow volume (also referred to as the supplied refrigerant flow volume F) of a liquid-phase refrigerant circulating inside the supply pipe 21. Moreover, the refrigerant information acquisition device 51 measures a temperature (also referred to as the discharged refrigerant temperature $T_{ro}$) and pressure (also referred to as the discharged refrigerant pressure p) of a gas-phase refrigerant circulating inside the discharge pipe 25. The refrigerant information acquisition device 51 transmits the measured supplied refrigerant temperature $T_{ri}$, supplied refrigerant flow volume F, discharged refrigerant temperature $T_{ro}$, and discharged refrigerant pressure p to the management device 10. Hereinafter, the supplied refrigerant temperature $T_{ri}$, the supplied refrigerant flow volume F, the discharged refrigerant temperature $T_{ro}$, and the discharged refrigerant pressure p are also collectively referred to as refrigerant information.

Note that the refrigerant information may be replaced by information collected by use of information communication from a controller (not illustrated) which controls the cooling device 20.

Air introduced from a front surface of the heating element 100 is warmed by drawing heat from a heating element such as a server when passing inside the heating element 100, and discharged from the heating element 100 as exhaust air. The exhaust air of the heating element 100 is exchanged heat inside the cooling device 20, and is then released. The air released from the cooling device 20 is mixed with in-room air, and then re-supplied toward the heating element 100. Herein, a temperature of the in-room air becomes a temperature of air released into the room by the cooling device 20 in a steady state, that is, the predetermined cooling set temperature $T_{sr}$.

The heating element 100 has a structure inside which air passes. On the heating element 100, an intake surface into which in-room air is introduced, and an exhaust surface from which air passing inside is discharged to outside are formed. In the present example embodiment, the cooling device 20 is disposed on the exhaust side of the heating element 100.

The heating element 100 is connected to a power source 110 which supplies power via a power line 130. Note that the power source 110 may be a general commercial power source, or may be a dedicated power source of a facility in which the cooling system 1 and the heating element 100 are placed.

The power measurement instrument 53 is disposed in the power line 130. The power measurement instrument 53 measures power (hereinafter, power consumption) supplied to the heating element 100 via the power line 130. The power measurement instrument 53 transmits the measured power consumption to the management device 10. Power measured by the power measurement instrument 53 is equivalent to power consumption of the heating element 100. Note that information relating to a power value measured by the power measurement instrument 53 may be replaced by a power value collected by use of information communication from the heating element 100.

The above is a description regarding an overview of the cooling system 1 according to the present example embodiment. Components of the cooling system 1 are described below in detail.

Management Device

Figure 2:
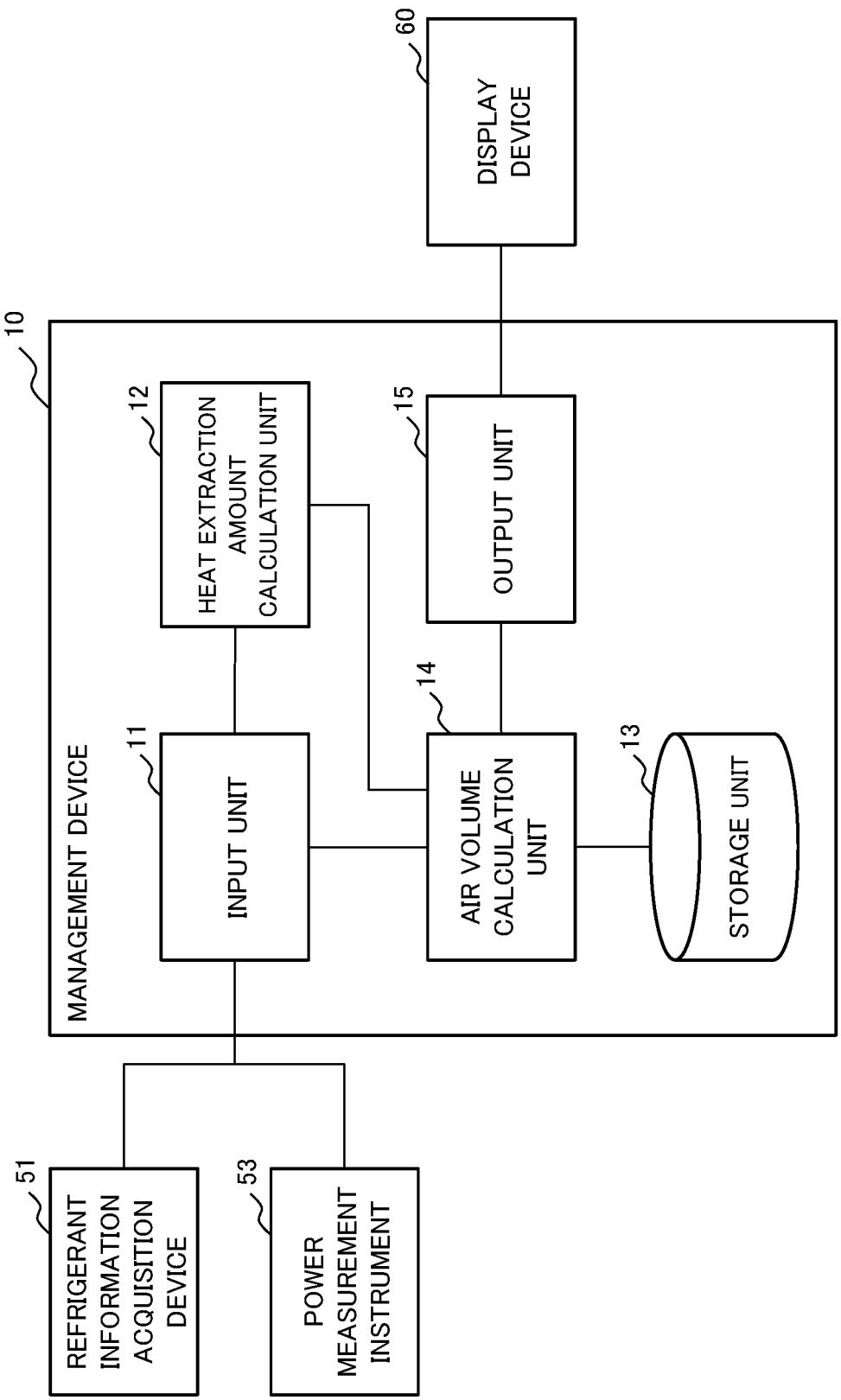
FIG. 2 is a block diagram illustrating a configuration of a management device of the cooling system according to the first example embodiment of the present invention.

FIG. 2 is a block diagram illustrating a detailed configuration of the management device 10. The management device 10 includes an input unit 11, a heat extraction amount calculation unit 12, a storage unit 13, an air volume calculation unit 14, and an output unit 15. In the present example embodiment, an example in which an output of the management device 10 is displayed on a display device 60 is indicated. The display device 60 is a general display. Note that an output of the management device 10 may be transmitted to another system, or used for some calculation, without being displayed on the display device 60.

The input unit 11 is connected to the refrigerant information acquisition device 51 and the power measurement instrument 53. Moreover, the input unit 11 is connected to the heat extraction amount calculation unit 12 and the air volume calculation unit 14.

The input unit 11 inputs refrigerant information of a refrigerant used in the cooling device 20, and the power consumption P of the heating element 100. Specifically, the input unit 11 acquires, as refrigerant information, the supplied refrigerant temperature $T_{ri}$, the supplied refrigerant flow volume F, the discharged refrigerant temperature $T_{ro}$, and the discharged refrigerant pressure p from the refrigerant information acquisition device 51, and acquires the power consumption P from the power measurement instrument 53. The input unit 11 outputs the acquired refrigerant state information and power consumption P to the heat extraction amount calculation unit 12 and the air volume calculation unit 14.

The heat extraction amount calculation unit 12 is connected to the input unit 11 and the air volume calculation unit 14. The heat extraction amount calculation unit 12 acquires refrigerant information from the input unit 11. The heat extraction amount calculation unit 12 calculates a heat extraction amount E by use of the refrigerant information acquired from the input unit 11, and a cooling capacity CL of a refrigerant. The cooling capacity CL is an exhaust heat amount per unit flow volume of a refrigerant circulating in the cooling device 20. While the cooling capacity CL varies depending on the supplied refrigerant temperature $T_{ri}$, the discharged refrigerant temperature $T_{ro}$, and the discharged refrigerant pressure p, a value preset based on the supplied refrigerant temperature $T_{ri}$ may be stored in the heat extraction amount calculation unit 12. The heat extraction amount calculation unit 12 outputs the calculated heat extraction amount E to the air volume calculation unit 14.

Specifically, the heat extraction amount calculation unit 12 calculates the heat extraction amount E by applying the cooling capacity CL, a flow volume (the supplied refrigerant flow volume F) of a refrigerant supplied to the cooling device 20, and density (hereinafter, supplied refrigerant density d) of a supplied refrigerant to Equation 1 below. Note that the supplied refrigerant flow volume F is an actually measured value measured by the refrigerant information acquisition device 51.

$$E = CL \times F \times d \quad (1)$$

In Equation 1, a product of the supplied refrigerant flow volume F and the supplied refrigerant density d is equivalent to a mass flux. In other words, the heat extraction amount E is equivalent to a product of the cooling capacity CL of a refrigerant and a mass flux.

Furthermore, the heat extraction amount calculation unit 12 may calculate the cooling capacity CL, based on the actually measured supplied refrigerant temperature $T_{ri}$, discharged refrigerant temperature $T_{ro}$, and discharged refrigerant pressure p. For example, the cooling capacity CL of a refrigerant is derived by use of a Mollier diagram.

Figure 3:
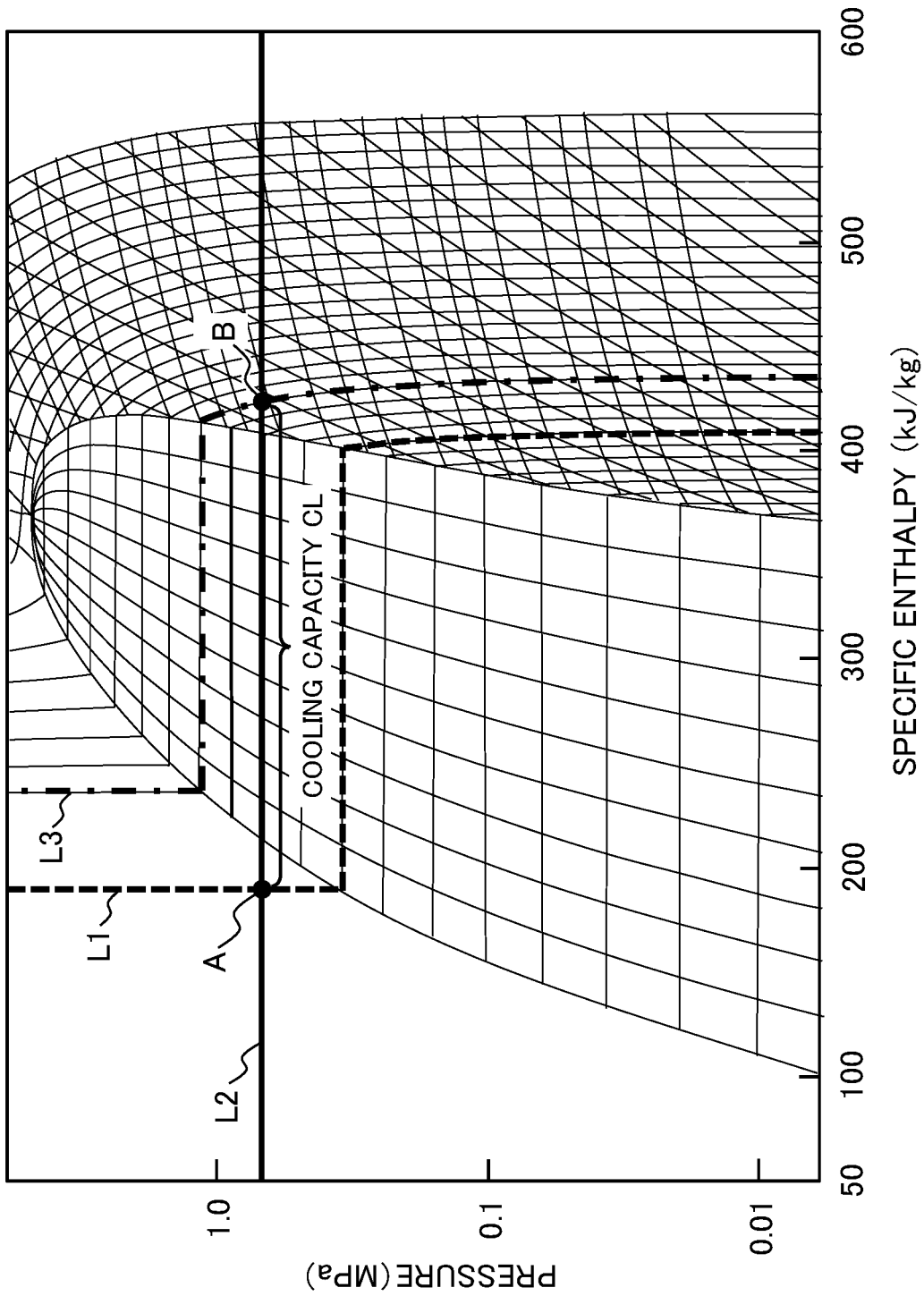
FIG. 3 is one example of a Mollier diagram referred to when a heat extraction amount calculation unit of the management device of the cooling system according to the first example embodiment of the present invention calculates a heat extraction amount.

Herein, a method of acquiring the cooling capacity CL of a refrigerant by use of a Mollier diagram in FIG. 3 is described. In FIG. 3, a change amount of a specific enthalpy of a refrigerant circulating inside the pipe of the cooling device 20 is equivalent to the cooling capacity CL.

First, an isothermal line L1 (a broken line in FIG. 3) after inflation of supercooled liquid is calculated, based on the liquid-phase supplied refrigerant temperature $T_{ri}$. Next, an isobaric line L2 (a heavy line in FIG. 3) of heating steam is calculated, based on the gas-phase discharged refrigerant pressure p, and an intersection point A of the isothermal line L1 (the broken line in FIG. 3) and the isobaric line L2 (the heavy line in FIG. 3) is acquired. Next, an isothermal line L3 (a chain line in FIG. 3) of heating steam is calculated, based on the gas-phase discharged refrigerant temperature $T_{ro}$, and an intersection point B of the isobaric line L2 (the heavy line in FIG. 3) and the isothermal line L3 (the chain line in FIG. 3) is acquired. A difference of specific enthalpies between the point A and the point B is equivalent to an exhaust heat amount (the cooling capacity CL) per unit flow volume.

Herein, a specific enthalpy at an intersection point of the isothermal line L1 after inflation of supercooled liquid based on the supplied refrigerant temperature $T_{ri}$ and the isobaric line L2 of heating steam based on the discharged refrigerant pressure p is designated as a first specific enthalpy. Moreover, a specific enthalpy at an intersection point of the isothermal line L3 of heating steam based on the discharged refrigerant temperature $T_{ro}$ and the isobaric line L2 is designated as a second specific enthalpy. The heat extraction amount calculation unit 12 derives a difference between the second specific enthalpy and the first specific enthalpy as cooling capacity.

For example, three variables including a temperature after inflation of supercooled liquid, and a temperature and pressure of superheated steam are designated as independent variables, and stored in the heat extraction amount calculation unit 12 in a form of a relational expression which designates the cooling capacity CL as a dependent variable. The cooling capacity CL is acquired by using measurement values of the supplied refrigerant temperature $T_{ri}$, the discharged refrigerant temperature $T_{ro}$, and the discharged refrigerant pressure p. However, a derivation method of the cooling capacity CL is not limited to the technique in the above-described example.

Figure 4:
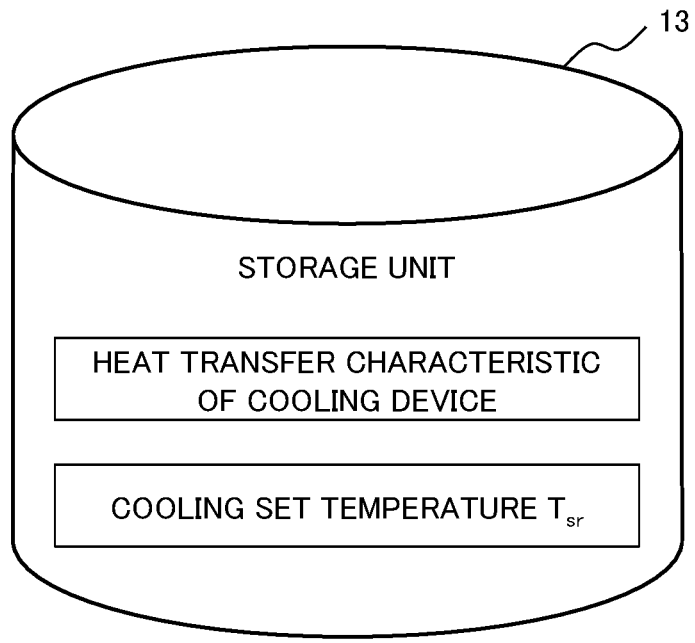
FIG. 4 is a conceptual diagram illustrating an information example stored in a storage unit included in the management device of the cooling system according to the first example embodiment of the present invention.

The storage unit 13 is connected to the air volume calculation unit 14 (FIG. 2). FIG. 4 is a conceptual diagram illustrating information stored in the storage unit 13. As in FIG. 4, the storage unit 13 stores a heat transfer characteristic of the cooling device 20, and the cooling set temperature $T_{sr}$. In other words, in the present example embodiment, the cooling set temperature $T_{sr}$ of the cooling device 20, and a heat transfer characteristic are stored in the storage unit 13.

The air volume calculation unit 14 is connected to the input unit 11, the heat extraction amount calculation unit 12, the storage unit 13, and an output unit 15 (FIG. 2). The air volume calculation unit 14 acquires a discharged refrigerant temperature $T_{rg}$ and the power consumption P from the input unit 11, and also acquires the heat extraction amount E from the heat extraction amount calculation unit 12. Further, the air volume calculation unit 14 acquires a heat transfer characteristic of the cooling device 20, and the cooling set temperature $T_{sr}$ from the storage unit 13.

Figure 5:
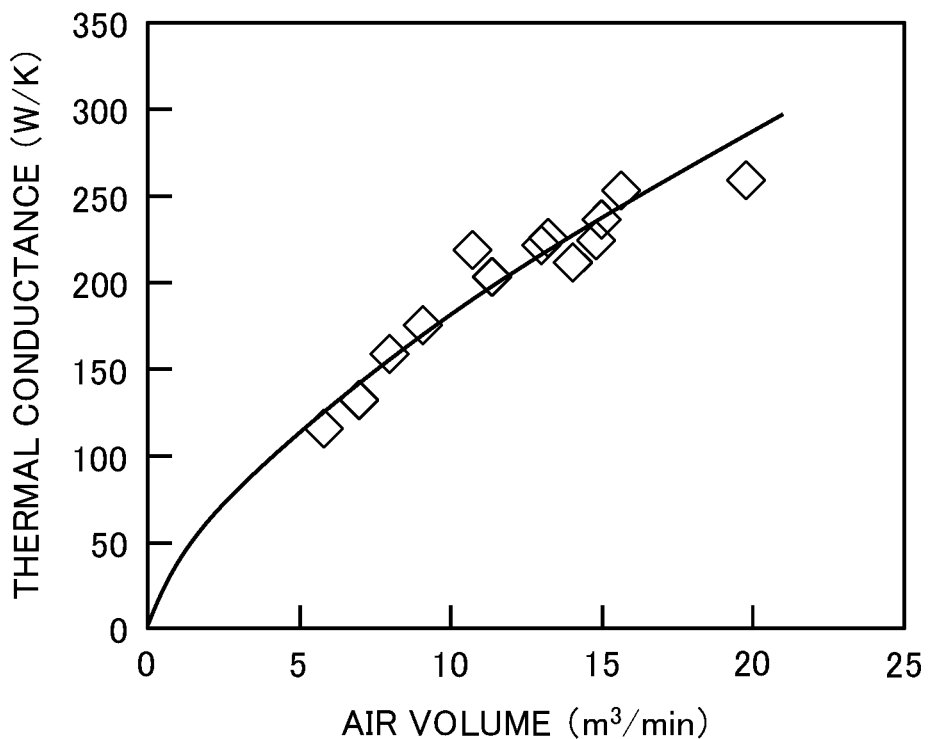
FIG. 5 is a graph illustrating one example of a heat transfer characteristic of a cooling device stored in the storage unit of the management device of the cooling system according to the first example embodiment of the present invention.

The heat transfer characteristic of the cooling device 20 is a characteristic which associates an air volume V of air supplied to the cooling device 20 with thermal conductance C of the cooling device 20. FIG. 5 is one example of a heat transfer characteristic of the cooling device 20. A vertical axis (the thermal conductance C) in the graph of FIG. 5 indicates a heat extraction amount per unit temperature of a temperature difference between the exhaust air temperature $T_o$ and a supplied refrigerant temperature $T_{ri}$. The graph of FIG. 5 is acquired by actually measuring the thermal conductance C of the heating element 100 associated with an air volume. For example, a function which designates an air volume as an independent variable and designates the thermal conductance C as a dependent variable may be stored in the storage unit 13 as a heat transfer characteristic of the cooling device 20.

The heat transfer characteristic in FIG. 5 indicates that a heat extraction amount per unit temperature of a temperature difference between the exhaust air temperature $T_o$ and the supplied refrigerant temperature $T_{ri}$ is monotonously increased in accordance with an increase of the air volume V, as long as the temperature (exhaust air temperature $T_o$) of air supplied to the cooling device 20 and the supplied refrigerant temperature $T_{ri}$ are constant. Further, the heat transfer characteristic in FIG. 5 indicates that a heat extraction amount is increased in proportion to the above-described temperature difference, as long as the air volume V of air supplied to a heating element is constant.

The air volume calculation unit 14 calculates the air volume V of air supplied to the cooling device 20 by use of the heat transfer characteristic of the cooling device 20, and air volume dependence (hereinafter, referred to as air volume dependence of difference temperature dT) of the difference temperature dT between a temperature of a refrigerant of the cooling device 20, and a temperature of exhaust air from the heating element 100. The air volume dependence of the difference temperature dT is a characteristic which associates an air volume V of air supplied to the cooling device 20 with the difference temperature dT between an exhaust air temperature $T_o$ of the heating element 100 and the supplied refrigerant temperature $T_{ri}$. The difference temperature dT is calculated from Equation 2 below.

$$dT = T_o - T_{ri} \quad (2)$$

The exhaust air temperature $T_o$ can be expressed by a function as Equation 3 below by use of the air volume: V, the intake air temperature $T_i$, the power consumption P, density c of air, and specific heat ρ.

$$T_o = T_i + P/(c \times \rho \times V) \quad (3)$$

Figure 6:
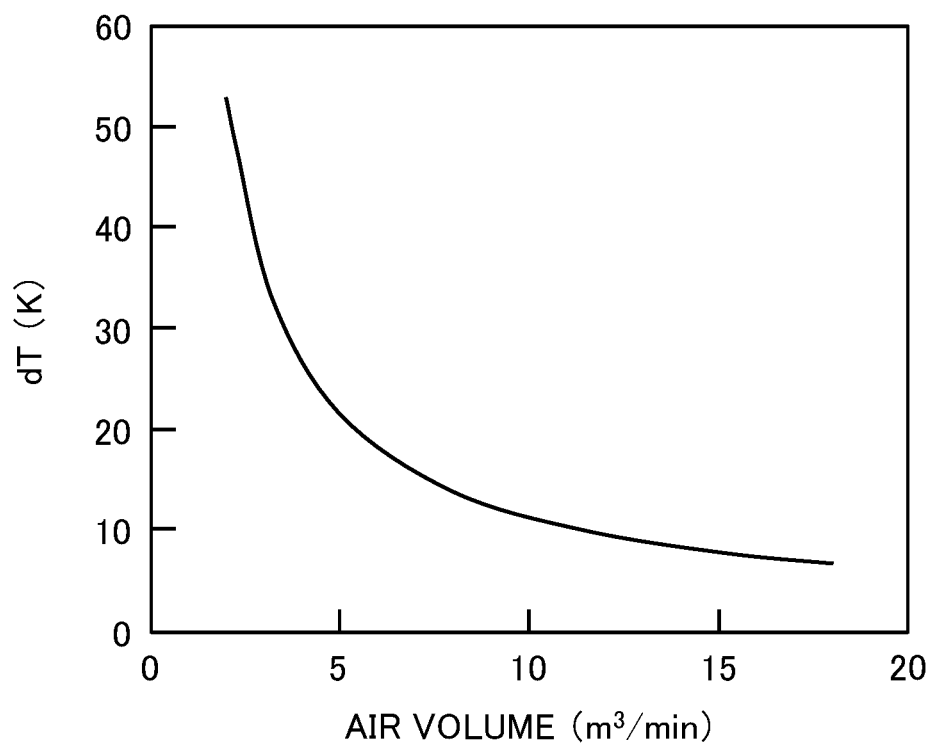
FIG. 6 is a graph illustrating one example of air volume dependence of a difference temperature between a temperature of a refrigerant and a temperature of exhaust air from a heating element regarding the cooling device of the cooling system according to the first example embodiment of the present invention.

FIG. 6 is one example of a graph in which the air volume V of air supplied to the cooling device 20 is associated with the difference temperature dT. The graph in FIG. 6 indicates air volume dependence of the difference temperature dT. When the air volume V is small, a time in which air stays inside the heating element 100 is prolonged, and the exhaust air temperature $T_o$ becomes higher. On the other hand, when the air volume V is great, a time in which air stays inside the heating element 100 is shortened, and the exhaust air temperature $T_o$ becomes lower.

Air volume dependence of the heat extraction amount E of the cooling device 20 can be derived by combining air volume dependence (the heat transfer characteristic of the cooling device 20) of the thermal conductance C illustrated in FIG. 5 with air volume dependence of the difference temperature dT illustrated in FIG. 6. In other words, the air volume V of air supplied to the cooling device 20 can be calculated by applying the heat extraction amount E calculated by the heat extraction amount calculation unit 12 to the air volume dependence of the heat extraction amount E of the cooling device 20. The heat extraction amount E of the cooling device 20 is derived by use of the heat transfer characteristic of the cooling device 20 and the air volume dependence of the difference temperature dT, which is derived by use of the power consumption P, of the cooling device 20.

Figure 7:
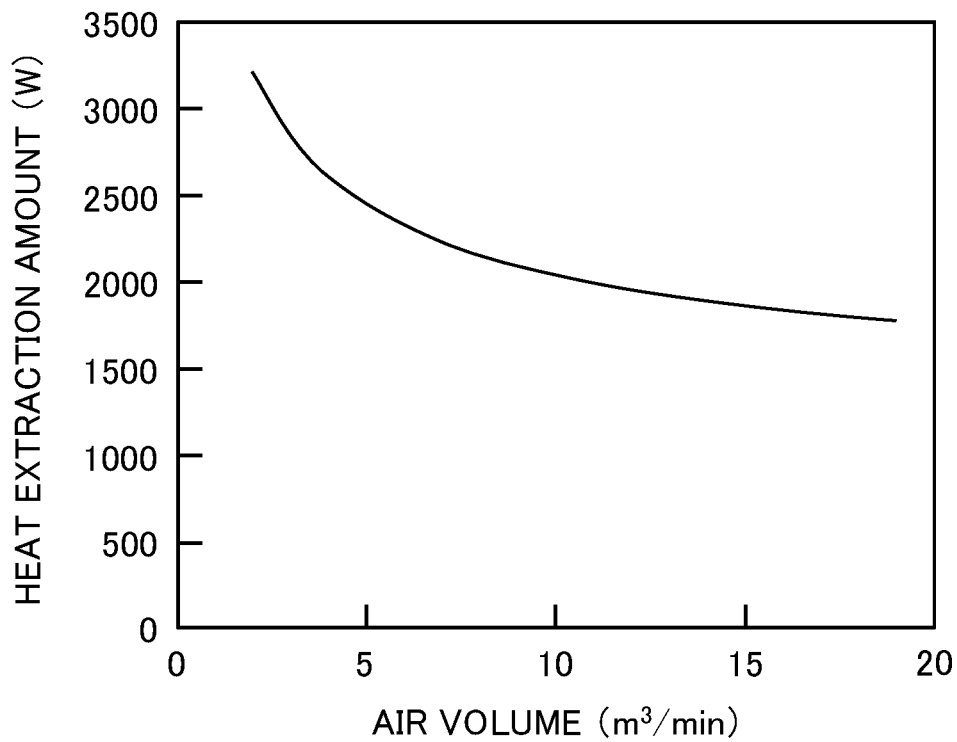
FIG. 7 is a graph illustrating one example of air volume dependence of a heat extraction amount regarding the cooling device of the cooling system according to the first example embodiment of the present invention.

A relation between the air volume V and the heat extraction amount E is derived by integrating the thermal conductance C of the heat transfer characteristic of the cooling device 20 illustrated in FIG. 5 with the difference temperature dT in FIG. 6. FIG. 7 is a graph illustrating air volume dependence of the heat extraction amount E of the cooling device 20 acquired by combining the air volume dependence of the thermal conductance C with the air volume dependence of the difference temperature dT. The air volume V (horizontal axis) associated with the heat extraction amount E (vertical axis) calculated by the heat extraction amount calculation unit 12 is acquired by using the relation in the graph in FIG. 7.

The air volume calculation unit 14 calculates the air volume V (horizontal axis) by applying the heat extraction amount E (vertical axis) calculated by the heat extraction amount calculation unit 12 to the relation (the air volume dependence of the heat extraction amount E of the cooling device 20) between the air volume V and the heat extraction amount E illustrated in FIG. 7. The air volume calculation unit 14 outputs the calculated air volume V to the output unit 15. Note that the air volume calculation unit 14 uses the supplied refrigerant temperature $T_{ri}$ as a refrigerant temperature, but may use the discharged refrigerant temperature $T_{rg}$ as a refrigerant temperature, when a heat transfer characteristic is information based on a difference between the exhaust air temperature $T_o$ and the discharged refrigerant temperature $T_{rg}$.

The output unit 15 is connected to the air volume calculation unit 14 (FIG. 2). Moreover, in the example of FIG. 2, the output unit 15 is connected to the display device 60. The output unit 15 outputs an air volume output from the air volume calculation unit 14 to the display device 60. Note that the output unit 15 may be configured in such a way as to output an air volume to a system or a device which is not the display device 60.

Refrigerant Information Acquisition Device

Figure 8:
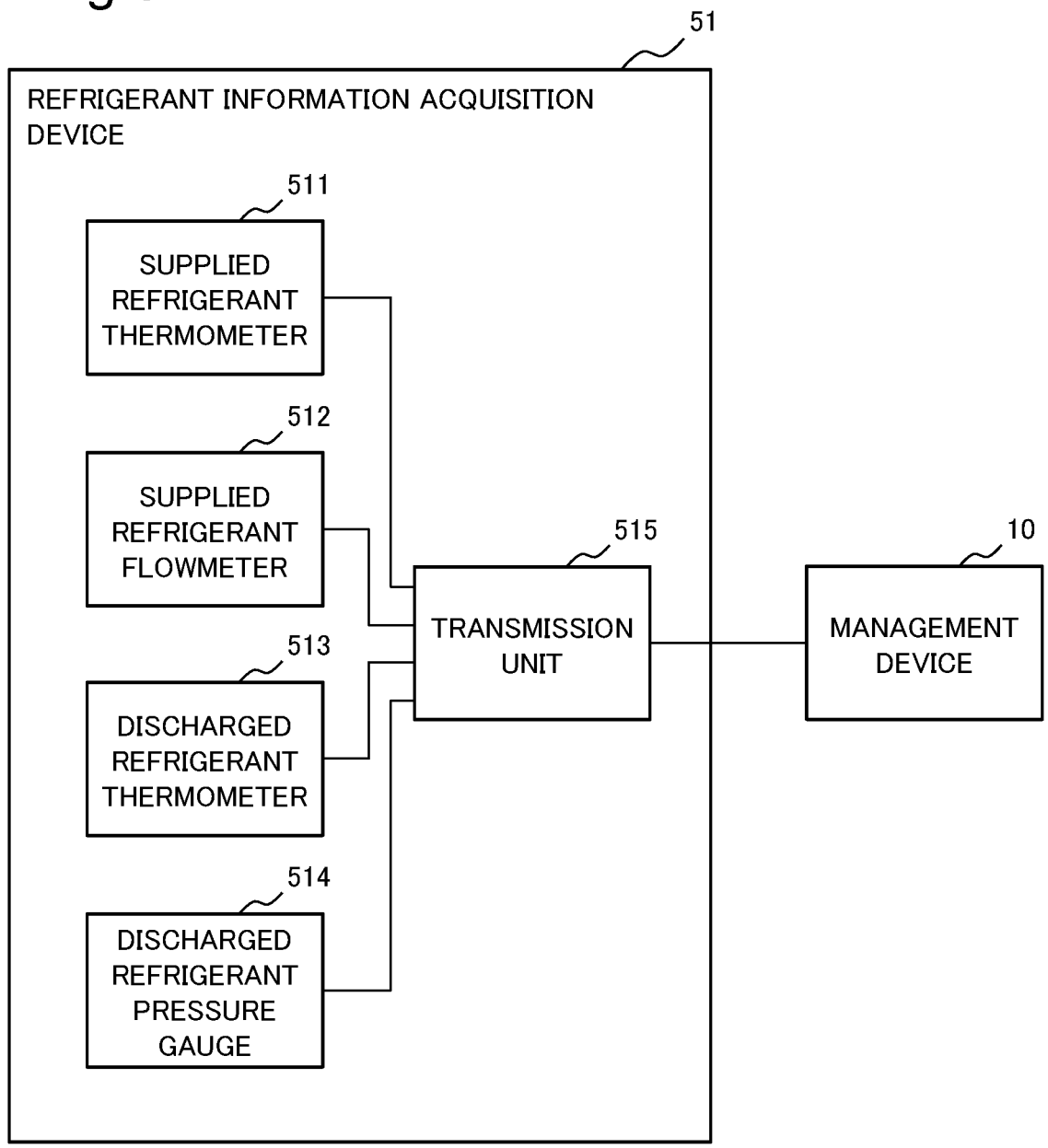
FIG. 8 is a block diagram illustrating a configuration of a refrigerant information acquisition device connected to the management device of the cooling system according to the first example embodiment of the present invention.

Next, the refrigerant information acquisition device 51 is described. FIG. 8 is a block diagram illustrating a configuration of the refrigerant information acquisition device 51. As in FIG. 8, the refrigerant information acquisition device 51 includes a supplied refrigerant thermometer 511, a supplied refrigerant flowmeter 512, a discharged refrigerant thermometer 513, a discharged refrigerant pressure gauge 514, and a transmission unit 515. The supplied refrigerant thermometer 511 and the supplied refrigerant flowmeter 512 are disposed in the supply pipe 21, and communicably connected to the transmission unit 515. Moreover, the discharged refrigerant thermometer 513 and the discharged refrigerant pressure gauge 514 are disposed in the discharge pipe 25, and communicably connected to the transmission unit 515.

The supplied refrigerant thermometer 511 measures a temperature (the supplied refrigerant temperature $T_{ri}$) of a refrigerant circulating inside the supply pipe 21. The supplied refrigerant thermometer 511 may be placed inside or outside the supply pipe 21. For example, the supplied refrigerant thermometer 511 can be achieved by a thermocouple, a resistance thermometer, a contactless thermometer, or the like. The supplied refrigerant thermometer 511 outputs the measured supplied refrigerant temperature $T_{ri}$ to the transmission unit 515.

The supplied refrigerant flowmeter 512 measures a flow volume (the supplied refrigerant flow volume F) of a refrigerant circulating inside the supply pipe 21. The supplied refrigerant flowmeter 512 may be placed inside or outside the supply pipe 21. For example, the supplied refrigerant flowmeter 512 can be achieved by a volumetric flowmeter, a differential pressure type flowmeter, a Coriolis flowmeter, a vortex flowmeter, an ultrasonic flowmeter, a turbine flowmeter, a thermal mass flowmeter, or the like. The supplied refrigerant flowmeter 512 outputs the measured supplied refrigerant flow volume F to the transmission unit 515.

The discharged refrigerant thermometer 513 measures a temperature (the discharged refrigerant temperature $T_{ro}$) of a refrigerant circulating inside the discharge pipe 25. The discharged refrigerant thermometer 513 may be placed inside or outside the discharge pipe 25. For example, the discharged refrigerant thermometer 513 can be achieved by a thermocouple, a resistance thermometer, a contactless thermometer, or the like. The discharged refrigerant thermometer 513 outputs the measured discharged refrigerant temperature $T_{ro}$ to the transmission unit 515.

The discharged refrigerant pressure gauge 514 measures pressure (the discharged refrigerant pressure p) of a refrigerant circulating inside the discharge pipe 25. For example, the discharged refrigerant pressure gauge 514 can be achieved by a weight-drop type pressure gauge, a dispersion type semiconductor strain gauge, a resonant sensor, or the like. The discharged refrigerant pressure gauge 514 outputs the measured discharged refrigerant pressure p to the transmission unit 515.

The transmission unit 515 acquires the supplied refrigerant temperature $T_{ri}$ from the supplied refrigerant thermometer 511, and acquires the supplied refrigerant flow volume F from the supplied refrigerant flowmeter 512. Moreover, the transmission unit 515 acquires the discharged refrigerant temperature $T_{ro}$ from the discharged refrigerant thermometer 513, and acquires the discharged refrigerant pressure p from the discharged refrigerant pressure gauge 514. The transmission unit 515 transmits, as refrigerant information, the acquired supplied refrigerant temperature $T_{ri}$, supplied refrigerant flow volume F, discharged refrigerant temperature $T_{ro}$, and discharged refrigerant pressure p to the management device 10. A timing at which the transmission unit 515 transmits refrigerant information can be set to any timing.

Power Measurement Instrument

Figure 9:
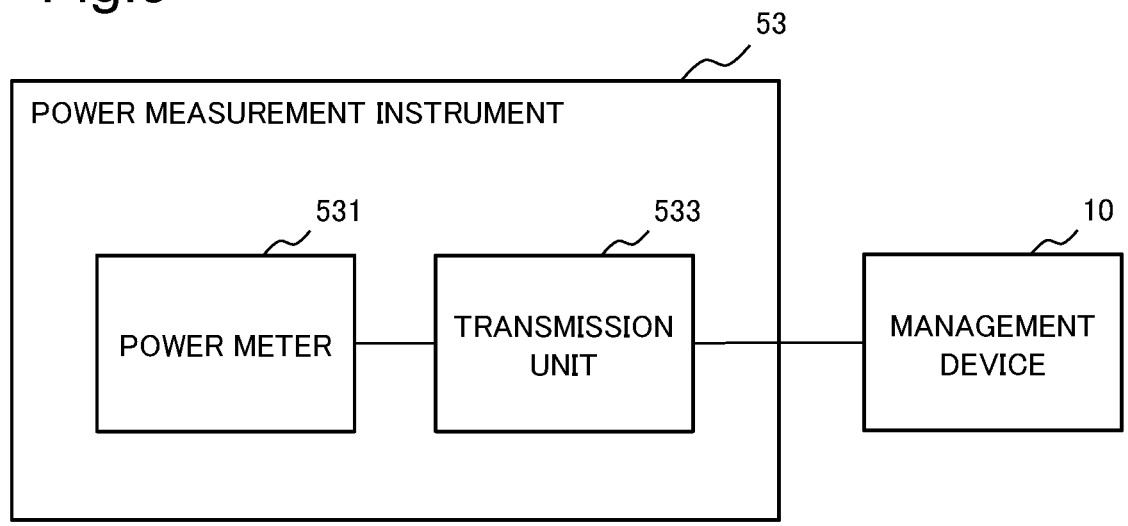
FIG. 9 is a block diagram illustrating a configuration of a power measurement instrument connected to the management device of the cooling system according to the first example embodiment of the present invention.

Next, the power measurement instrument 53 is described. FIG. 9 is a block diagram illustrating a configuration of the power measurement instrument 53. As in FIG. 9, the power measurement instrument 53 includes a power meter 531 and a transmission unit 533.

The power meter 531 is disposed in the power line 130 for supplying power to the heating element 100, and measures the power consumption P of the heating element 100. For example, the power meter 531 is preferably a power meter such as a clamp-type power meter which is able to measure power from outside of the power line 130. However, as long as the power meter 531 is able to measure the power consumption P of the heating element 100, no limitation is placed on a form of the power meter 531. The power meter 531 outputs the measured power consumption P to the transmission unit 533.

The transmission unit 533 acquires the power consumption P of the heating element 100 from the power meter 531. The transmission unit 533 transmits the acquired power consumption P to the management device 10.

Display Device

Figure 10:
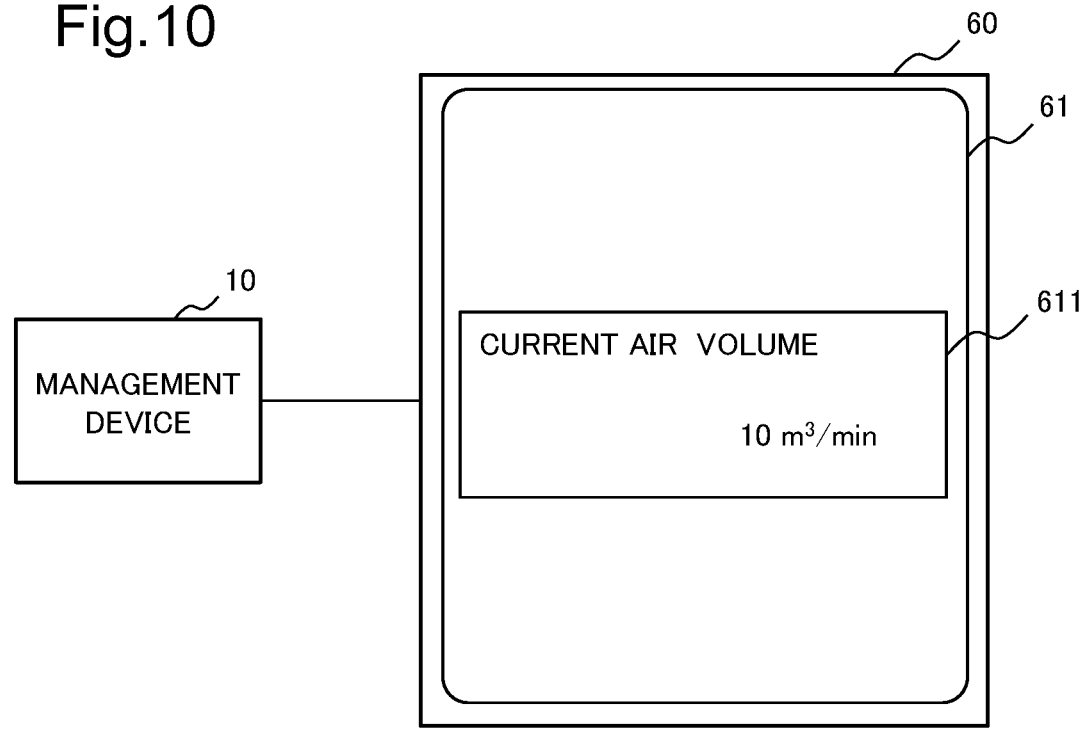
FIG. 10 is a conceptual diagram illustrating a display example of a display device connected to the management device of the cooling system according to the first example embodiment of the present invention.

FIG. 10 is one example in which information relating to an air volume output from the management device 10 is displayed on the display device 60. In the example of FIG. 10, a display part 611 which displays an air volume supplied to the cooling device 20 is displayed on a screen 61 of the display device 60. Note that information displayed on the display device 60 in FIG. 10 may include information other than an air volume such as a temperature of exhaust air or a refrigerant.

Operation

Figure 11:
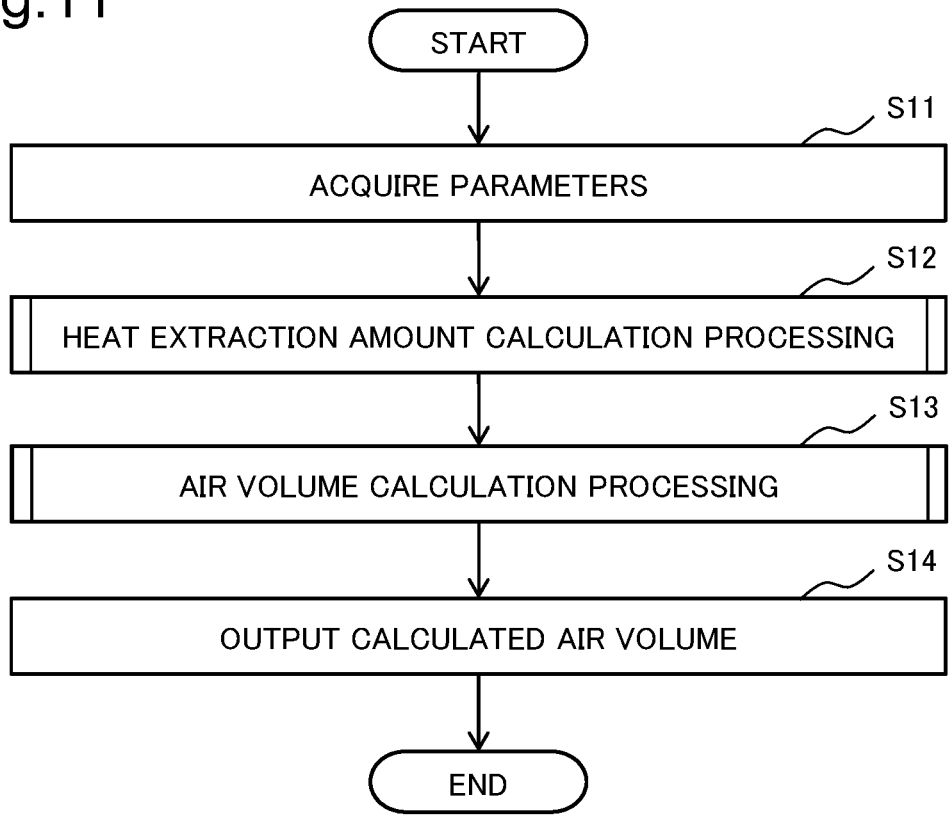
FIG. 11 is a flowchart illustrating an operation of the management device of the cooling system according to the first example embodiment of the present invention.

Next, an overview of an operation of the management device 10 according to the present example embodiment is described with reference to the drawings. FIG. 11 is a flowchart for describing an overview of an operation of the management device 10.

In FIG. 11, first, the management device 10 acquires parameters needed to calculate a heat extraction amount E and an air volume V (step S11). In the present example embodiment, the management device 10 acquires, as parameters, the supplied refrigerant temperature $T_{ri}$, the supplied refrigerant temperature $T_{ri}$, the supplied refrigerant flow volume F, the discharged refrigerant temperature $T_{ro}$, the discharged refrigerant pressure p, and the power consumption P.

Next, the management device 10 calculates a heat extraction amount E by heat extraction amount calculation processing (step S12). The heat extraction amount calculation processing will be described later by use of FIG. 12.

Next, the management device 10 calculates an air volume V by air volume calculation processing by use of the heat extraction amount E calculated by the heat extraction amount calculation processing (step S13). The air volume calculation processing will be described later by use of FIG. 13.

Then, the management device 10 outputs the air volume calculated by the air volume calculation processing (step S14).

Figure 12:
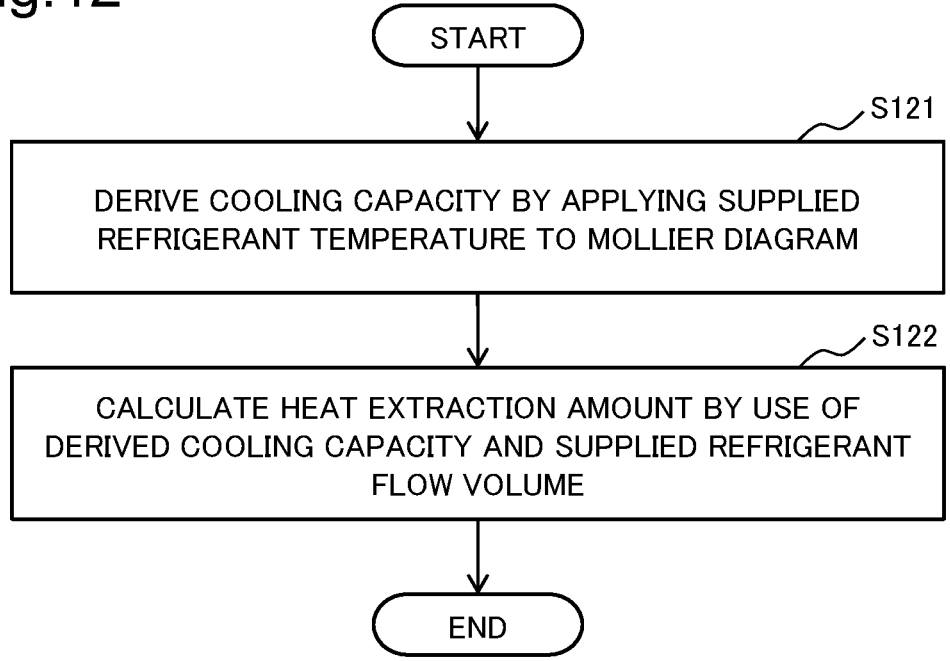
FIG. 12 is a flowchart relating to heat extraction amount calculation processing by the heat extraction amount calculation unit of the management device of the cooling system according to the first example embodiment of the present invention.
Figure 13:
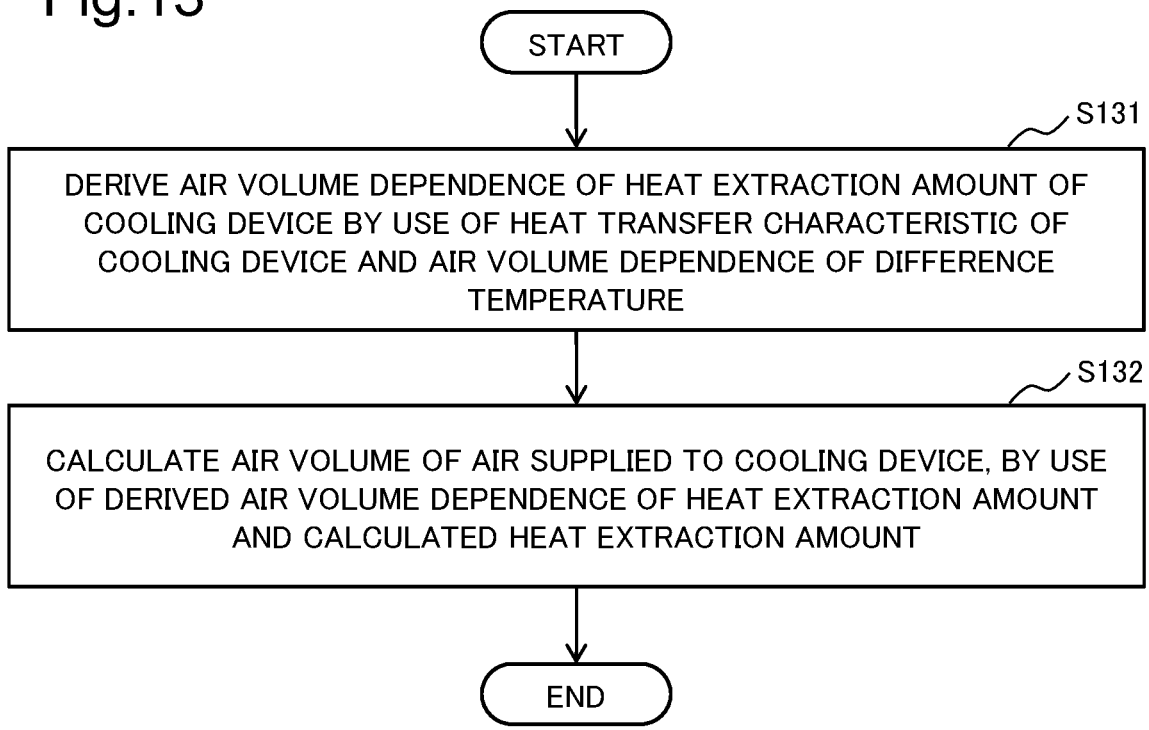
FIG. 13 is a flowchart relating to air volume calculation processing by an air volume calculation unit of the management device of the cooling system according to the first example embodiment of the present invention.

Next, the step S12 (the heat extraction amount calculation processing) and the step S13 (the air volume calculation processing) in the flowchart of FIG. 11 are described with reference to the drawings. FIG. 12 is a flowchart for describing the heat extraction amount calculation processing. FIG. 13 is a flowchart for describing the air volume calculation processing.

Heat Extraction Amount Calculation Processing

In FIG. 12, first, the heat extraction amount calculation unit 12 derives a cooling capacity CL of the cooling device 20 by applying a refrigerant temperature to a Mollier diagram for a refrigerant used in the cooling device 20 (step S121). Note that the step S121 can be omitted when a pre-stored cooling capacity CL is used.

Then, the heat extraction amount calculation unit 12 calculates a heat extraction amount by use of the derived cooling capacity CL and supplied refrigerant flow volume F (step S122).

Air Volume Calculation Processing

In FIG. 13, first, the air volume calculation unit 14 derives air volume dependence of the heat extraction amount E of the cooling device 20, by use of a heat transfer characteristic of the cooling device 20 and air volume dependence of a difference temperature dT between an exhaust heat temperature of the heating element 100 and a refrigerant temperature of the cooling device 20 (step S131).

Then, the air volume calculation unit 14 calculates an air volume V of air supplied to the cooling device 20, by use of the derived air volume dependence of the heat extraction amount E of the cooling device 20, and the heat extraction amount E calculated by the heat extraction amount calculation unit (step S132).

The above is a description regarding the step S12 (the heat extraction amount calculation processing) and the step S13 (the air volume calculation processing) in the flowchart of FIG. 11.

As described above, the management device according to the present example embodiment is able to calculate an air volume of air supplied to a cooling device without performing actual measurement, and notify a manager of the calculated air volume. In other words, the management device according to the present example embodiment is able to calculate an air volume of air supplied to a cooling device without using an air volume sensor. A manager is able to determine whether or not a current air volume is appropriate, by referring to air volume data output by the management device according to the present example embodiment.

Furthermore, when viewed from another aspect, the present example embodiment is able to calculate a supply air volume to a server rack, without adding an air volume sensor or a temperature sensor, by designating a cooling device placed on a back surface side of the server rack as an alternate means of an air volume sensor.

Second Example Embodiment

Configuration

Next, a configuration of a cooling system according to a second example embodiment of the present invention is described with reference to the drawings. The cooling system according to the present example embodiment is different from that according to the first example embodiment in including an air conditioning device which adjusts a temperature in a room where a heating element and the cooling system are placed.

Figure 14:
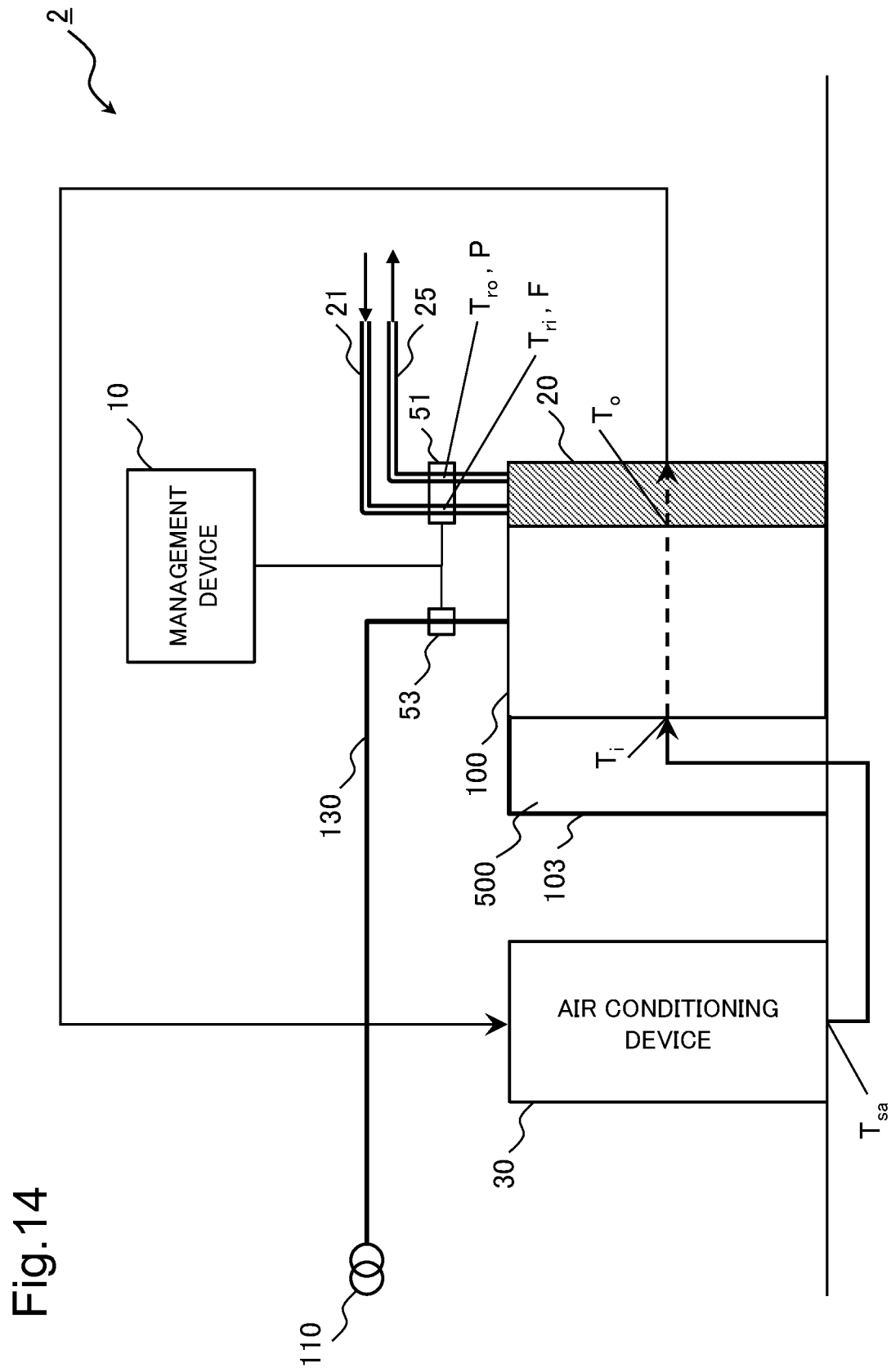
FIG. 14 is a block diagram illustrating a configuration of a cooling system according to a second example embodiment of the present invention.

FIG. 14 is a block diagram illustrating a configuration of a cooling system 2 according to the present example embodiment. As in FIG. 14, the cooling system 2 according to the present example embodiment includes an air conditioning device 30 in addition to a management device 10 and a cooling device 20. A description is omitted below with regard to a configuration and function similar to that according to the first example embodiment.

The air conditioning device 30 blows air to be supplied to a heating element 100. The example of FIG. 14 indicates an example in which air blown from the air conditioning device 30 is supplied under a floor to a cold aisle 500 formed by an aisle cap 103, and sucked to the heating element 100.

In the present example embodiment, a temperature in the room where the heating element 100 and the cooling system 2 are placed is set to a set temperature (hereinafter, an air conditioning set temperature: $T_{sa}$) of the air conditioning device 30. In the present example embodiment, it is considered that a temperature (hereinafter, an intake air temperature: $T_i$) of air supplied to the heating element 100 and the air conditioning set temperature $T_{sa}$ are equal to each other. In other words, a difference between the present example embodiment and the first example embodiment is that the intake air temperature $T_i$ of the heating element 100 is set to the air conditioning set temperature $T_{sa}$, and the present example embodiment is similar to the first example embodiment with regard to other points.

Figure 15:
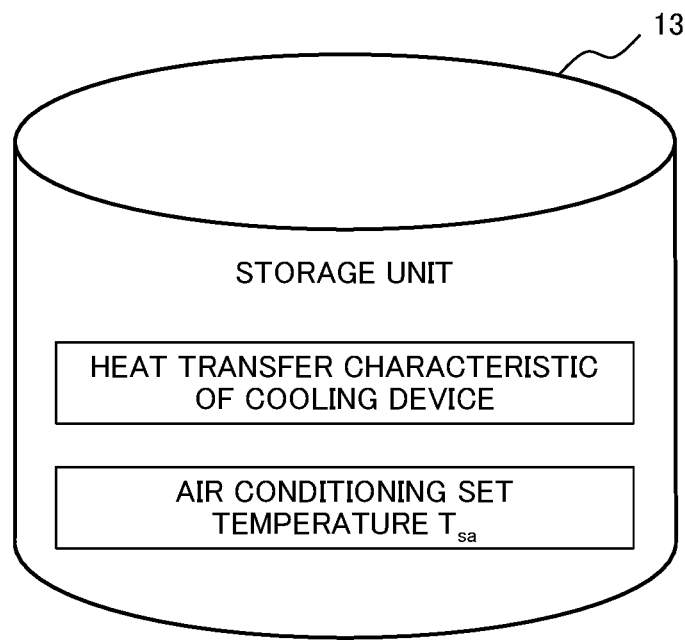
FIG. 15 is a conceptual diagram illustrating an information example stored in a storage unit included in a management device of the cooling system according to the second example embodiment of the present invention.

FIG. 15 is a conceptual diagram illustrating information stored in a storage unit 13 according to the present example embodiment. As in FIG. 15, the storage unit 13 stores a heat transfer characteristic of the cooling device 20, and the air conditioning set temperature $T_{sa}$.

Figure 16:
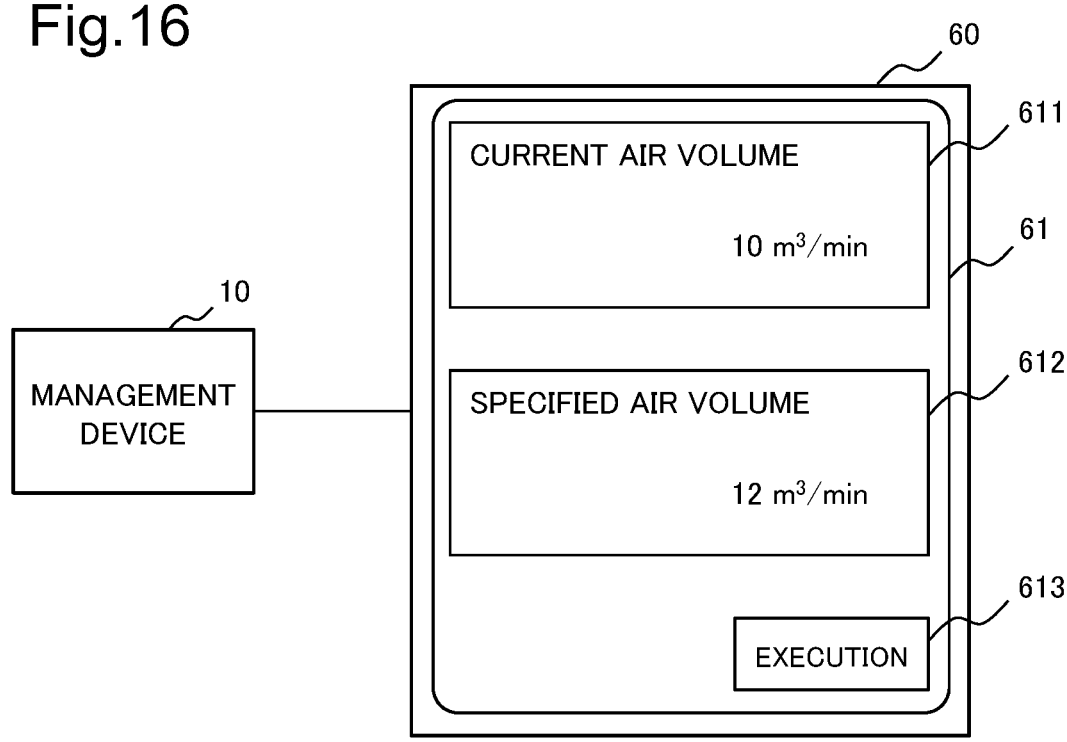
FIG. 16 is a conceptual diagram illustrating a display example of a display device connected to the management device of the cooling system according to the first example embodiment of the present invention.

FIG. 16 is one example in which information relating to an air volume output from the management device 10 is displayed on a display device 60. In the example of FIG. 16, a display part 611 which displays an air volume supplied to the cooling device 20, and an input part 612 with which a manager inputs a specified air volume are displayed on a screen 61 of the display device 60. For example, the display device 60 can be configured such that a numerical value input to the input part 612 can be set as an air volume of the air conditioning device 30 by pressing an execution button 613 for instructing to transmit a control signal. Note that information displayed on the display device 60 in FIG. 16 may include information other than an air volume.

The above is a description relating to the configuration of the cooling system 2 according to the present example embodiment. The operation of the cooling system 2 according to the present example embodiment is similar to that according to the first example embodiment, and therefore, a detailed description is omitted.

As described above, as in the first example embodiment, the present example embodiment is able to calculate an air volume of air supplied to a cooling device without performing actual measurement, and notify a manager of the calculated air volume. Moreover, in a data center which is totally cooled by total air conditioning as well, the present example embodiment is able to calculate an air volume of a heating element for which a cooling device is placed, and notify of a calculated air volume.

Third Example Embodiment

Next, a cooling system according to a third example embodiment of the present invention is described. The cooling system according to the present example embodiment is different from that according to the first example embodiment in calculating a temperature difference (hereinafter, a temperature rise value DT) between exhaust air and intake air of a heating element.

Figure 17:
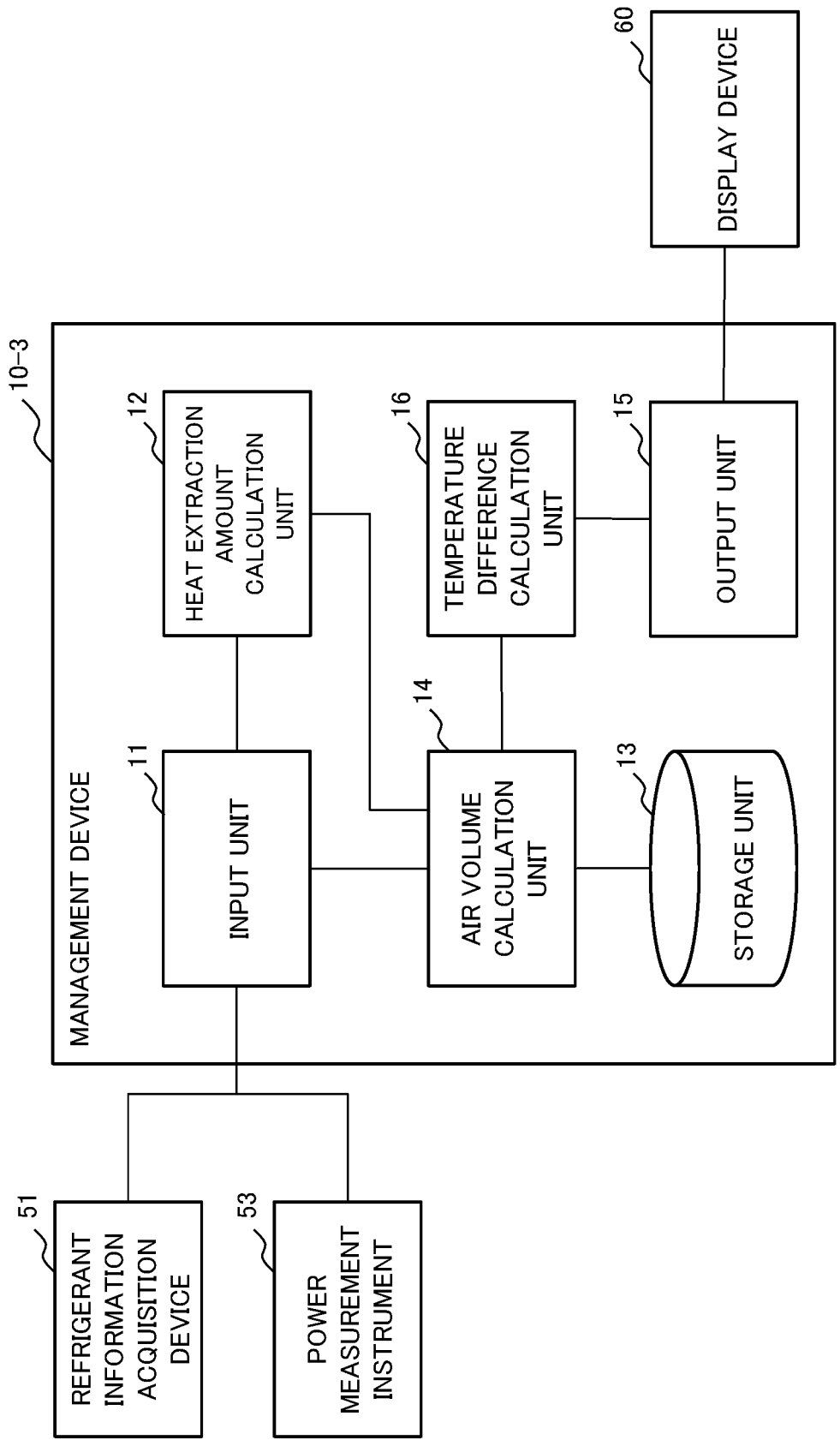
FIG. 17 is a block diagram illustrating a configuration of a management device of a cooling system according to a third example embodiment of the present invention.

FIG. 17 is a block diagram illustrating a configuration of a management device 10-3 included in the cooling system according to the present example embodiment. As in FIG. 17, the management device 10-3 includes a temperature difference calculation unit 16, in addition to an input unit 11, a heat extraction amount calculation unit 12, a storage unit 13, an air volume calculation unit 14, and an output unit 15. Note that main functions of the input unit 11, the heat extraction amount calculation unit 12, the air volume calculation unit 14, the storage unit 13, and the output unit 15 are similar to those in the management device 10 according to the first example embodiment, and therefore, a detailed description is omitted.

The temperature difference calculation unit 16 is connected to the air volume calculation unit 14 and the output unit 15. The temperature difference calculation unit 16 acquires an air volume V calculated by the air volume calculation unit 14, and calculates a temperature difference (the temperature rise value DT) between an exhaust air temperature $T_o$ and an intake air temperature $T_i$ of a heating element 100. Specifically, the temperature difference calculation unit 16 calculates the temperature rise value DT by substituting, for Equation 4 below, the exhaust air temperature $T_o$ acquired by substituting the air volume V for Equation 3 indicated in the first example embodiment, and an air conditioning set temperature $T_{sa}$ (the intake air temperature $T_i$) of an air conditioning device 30.

$$DT = T_o - T_{sa} \qquad (4)$$

The temperature difference calculation unit 16 outputs the calculated temperature rise value DT to the output unit 15.

The output unit 15 acquires the temperature rise value DT from the temperature difference calculation unit 16. The output unit 15 outputs the acquired temperature rise value DT to a display device 60. Note that the output unit 15 may also acquire an air volume V, and output the acquired air volume V together. When an output from the output unit 15 is displayed on the display device 60, a manager is able to refer to the temperature rise value DT and the air volume V.

Operation

Figure 18:
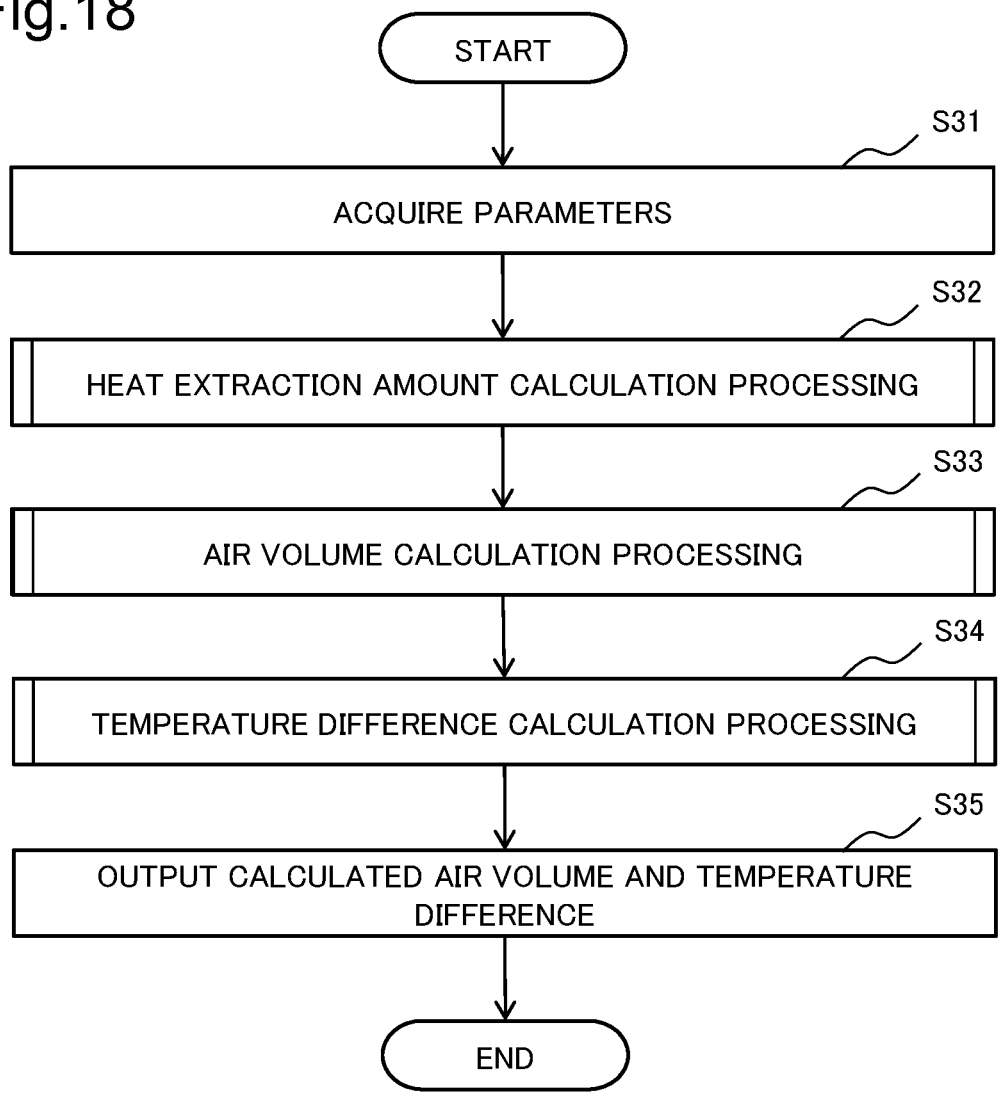
FIG. 18 is a flowchart illustrating an operation of the management device of the cooling system according to the third example embodiment of the present invention.

Next, an overview of an operation of the management device 10-3 according to the present example embodiment is described with reference to the drawings. FIG. 18 is a flowchart for describing an overview of an operation of the management device 10-3.

In FIG. 18, first, the management device 10-3 acquires parameters needed to calculate a heat extraction amount E and an air volume V (step S31). In the present example embodiment, the management device 10 acquires, as parameters, a supplied refrigerant temperature $T_{ri}$, a supplied refrigerant flow volume F, a discharged refrigerant temperature $T_{ro}$, discharged refrigerant pressure p, and power consumption P.

Next, the management device 10-3 calculates a heat extraction amount E by heat extraction amount calculation processing (step S32). The heat extraction amount calculation processing is as described by use of FIG. 12.

Next, the management device 10-3 calculates an air volume V by air volume calculation processing (step S33). The air volume calculation processing is as described by use of FIG. 13.

Next, the management device 10-3 calculates a difference (temperature rise value DT) between the exhaust air temperature $T_o$ and the intake air temperature $T_i$ of the heating element 100 by executing temperature difference calculation processing (step S34). The temperature difference calculation processing will be described later by use of FIG. 19.

Then, the management device 10-3 outputs the calculated air volume (step S35).

Figure 19:
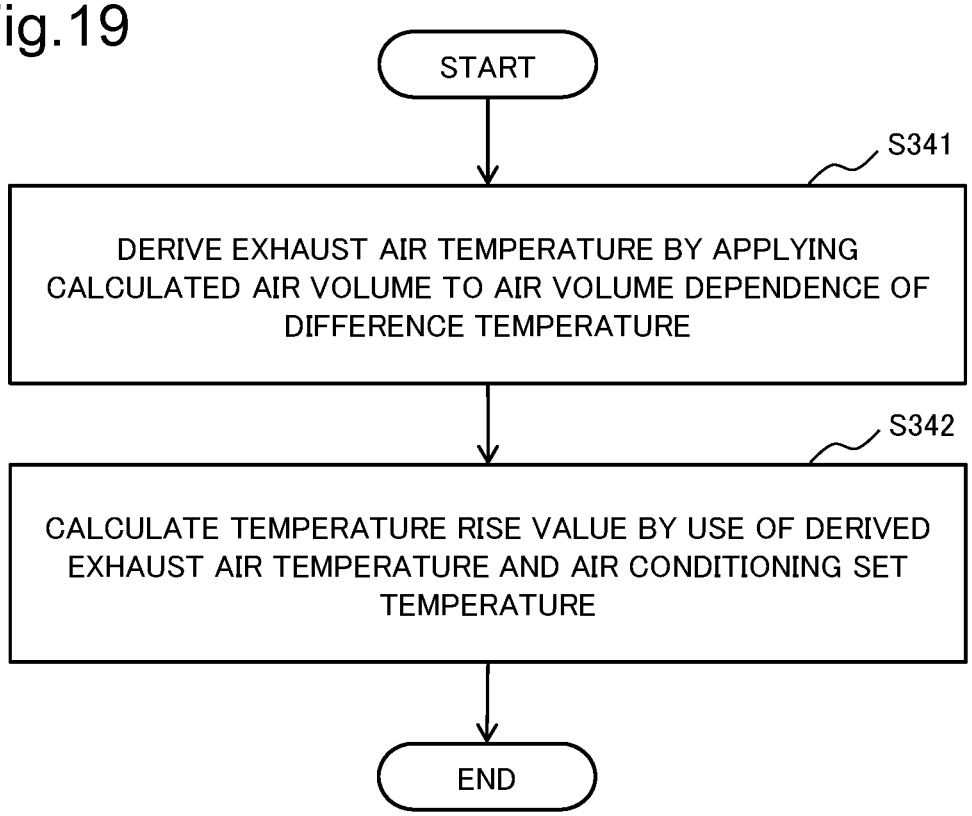
FIG. 19 is a flowchart relating to temperature difference calculation processing by a temperature difference calculation unit of the management device of the cooling system according to the third example embodiment of the present invention.

Next, the step S34 (the temperature difference calculation processing) in the flowchart of FIG. 18 is described with reference to the drawings. FIG. 19 is a flowchart for describing the temperature difference calculation processing.

Temperature Difference Calculation Processing

In FIG. 19, first, the temperature difference calculation unit 16 derives an exhaust air temperature $T_o$ of the heating element 100 by applying the calculated air volume to air volume dependence of a difference temperature of a cooling device 20 (step S341).

Then, the temperature difference calculation unit 16 calculates a temperature rise value DT by subtracting an air conditioning set temperature $T_{sa}$ (intake air temperature $T_i$) from the derived exhaust air temperature $T_o$ (step S342).

The above is a description regarding the step S34 (the temperature difference calculation processing) in the flowchart of FIG. 18.

As described above, the present example embodiment is able to calculate a temperature difference (temperature rise value) between an exhaust air temperature and a refrigerant temperature, in addition to being able to calculate an air volume of air supplied to a heating element. Thus, the present example embodiment is able to notify a manager of a temperature of air supplied to a cooling device, and a temperature rise value of air passing through a heating element, in addition to an air volume of air supplied to a cooling device.

Fourth Example Embodiment

Next, a cooling system according to a fourth example embodiment of the present invention is described with reference to the drawings. The cooling system according to the present example embodiment is different from that according to the third example embodiment in controlling an air conditioning device, based on an air volume of air supplied to a cooling device. Moreover, in the present example embodiment, information relating to a set air volume of an air conditioning device is used in order to control the air conditioning device.

Figure 20:
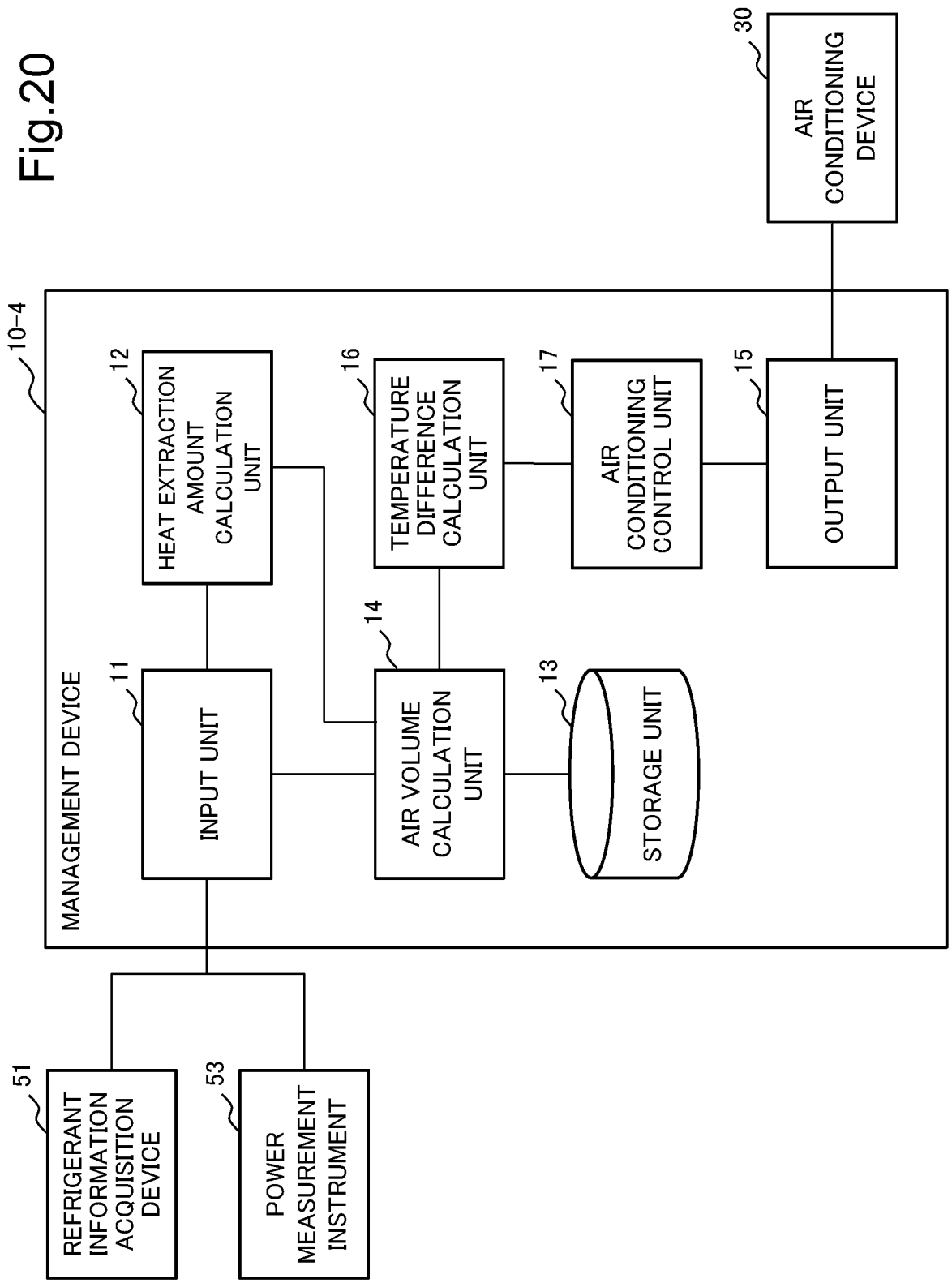
FIG. 20 is a block diagram illustrating a configuration of a management device of a cooling system according to a fourth example embodiment of the present invention.

FIG. 20 is a block diagram illustrating a configuration of a management device 10-4 included in the cooling system according to the present example embodiment. As in FIG. 20, the management device 10-4 includes an air conditioning control unit 17, in addition to an input unit 11, a heat extraction amount calculation unit 12, a storage unit 13, an air volume calculation unit 14, an output unit 15, and a temperature difference calculation unit 16. Moreover, the management device 10-4 is connected to an air conditioning device 30. Main functions of the input unit 11, the heat extraction amount calculation unit 12, the storage unit 13, the air volume calculation unit 14, the output unit 15, and the temperature difference calculation unit 16 are similar to those in the management device 10-3 according to the third example embodiment, and therefore, a detailed description is omitted.

Figure 21:
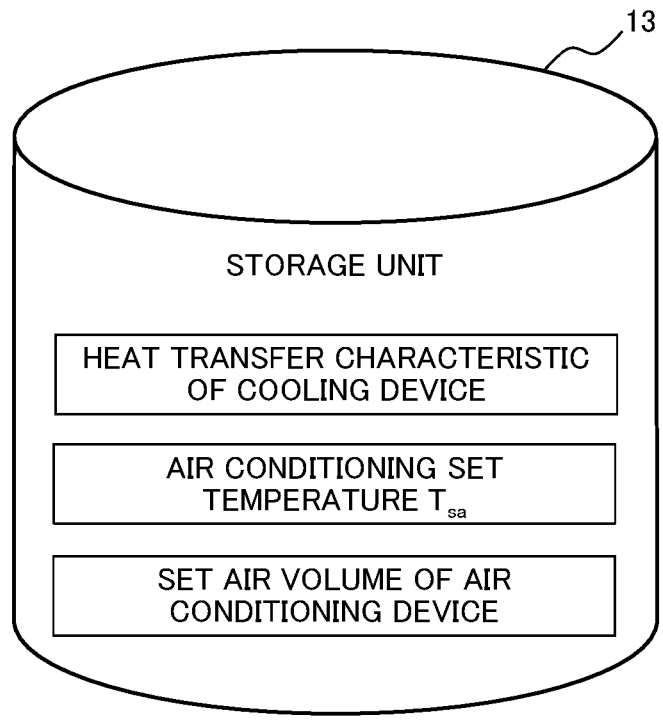
FIG. 21 is a conceptual diagram illustrating an information example stored in a storage unit included in the management device of the cooling system according to the fourth example embodiment of the present invention.

FIG. 21 is a conceptual diagram illustrating information stored in the storage unit 13 according to the present example embodiment. As in FIG. 21, the storage unit 13 stores a heat transfer characteristic of the cooling device 20, an air conditioning set temperature $T_{sa}$, and a set air volume of the air conditioning device 30.

The air conditioning control unit 17 is connected to the temperature difference calculation unit 16 and the output unit 15. The air conditioning control unit 17 acquires a temperature rise value DT calculated by the temperature difference calculation unit 16. Moreover, the air conditioning control unit 17 acquires a set air volume of the air conditioning device 30 from the storage unit 13. The air conditioning control unit 17 sets an air volume V of the air conditioning device 30 by use of the acquired temperature rise value DT and a set air volume of the air conditioning device 30. Then, the air conditioning control unit 17 outputs a control signal for setting the air volume V of the air conditioning device 30 to the output unit 15.

The output unit 15 acquires a control signal from the air conditioning control unit 17. The output unit 15 outputs the acquired control signal to the air conditioning device 30.

Air Conditioning Device

Figure 22:
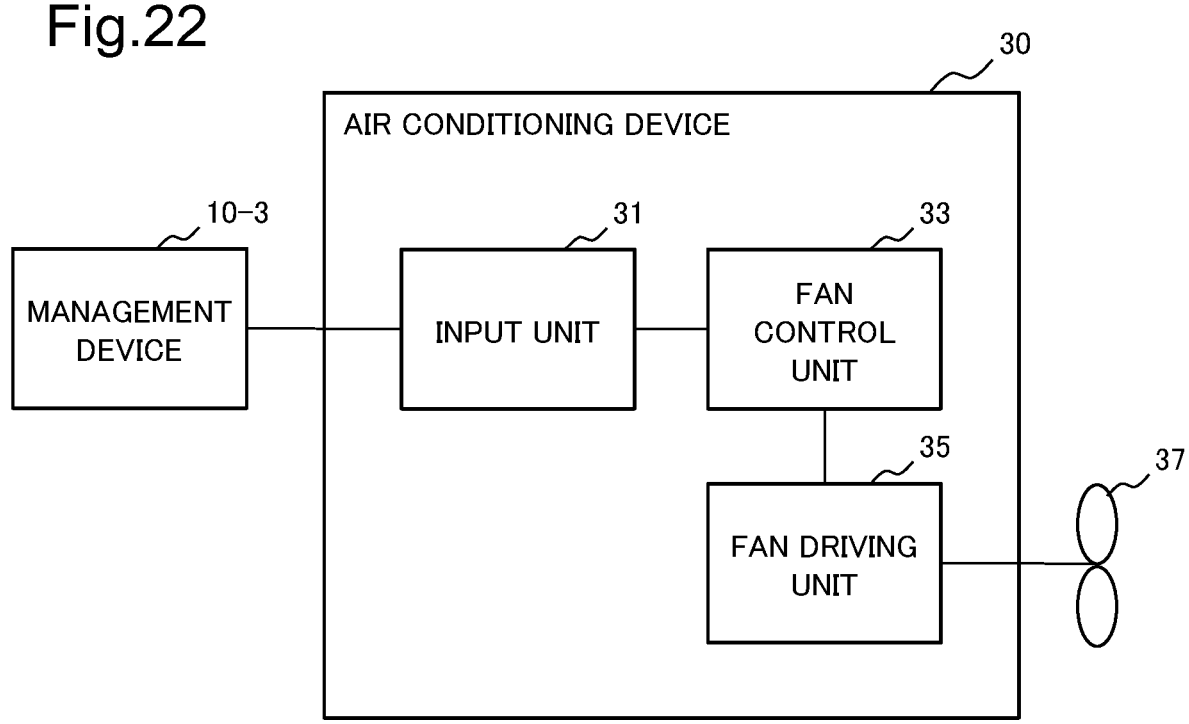
FIG. 22 is a block diagram illustrating a configuration of an air conditioning device included in the cooling system according to the fourth example embodiment of the present invention.

FIG. 22 is a block diagram illustrating a configuration of the air conditioning device 30. As in FIG. 22, the air conditioning device 30 includes an input unit 31, a fan control unit 33, a fan driving unit 35, and a fan 37. Note that FIG. 22 conceptually illustrates the configuration of the air conditioning device 30, and does not limit the configuration of the air conditioning device 30 according to the present example embodiment.

The input unit 31 receives a control signal from the management device 10-4. The input unit 31 outputs the received control signal to the fan control unit 33. The fan control unit 33 acquires the control signal from the input unit 31, and controls the fan driving unit 35 according to the received control signal. The fan driving unit 35 rotates the fan 37 according to the control of the fan control unit 33. The fan 37 is rotated by driving of the fan driving unit 35.

Operation

Figure 23:
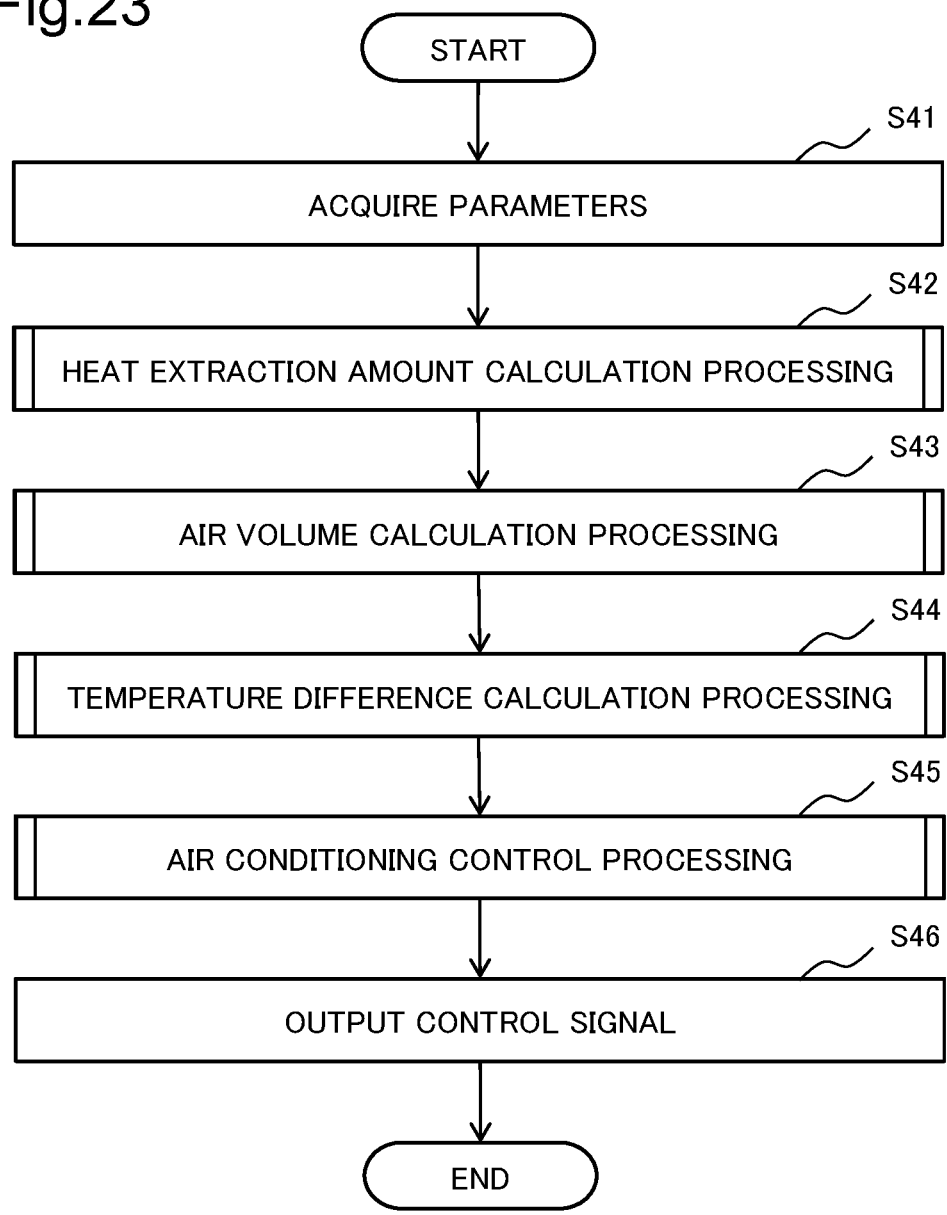
FIG. 23 is a flowchart illustrating an operation of the management device of the cooling system according to the fourth example embodiment of the present invention.

Next, an operation of the management device 10-4 according to the present example embodiment is described with reference to the drawings. FIG. 23 is a flowchart for describing an operation of the management device 10-4.

In FIG. 23, first, the management device 10-4 acquires parameters needed to calculate a heat extraction amount E and an air volume V (step S41). In the present example embodiment, the management device 10 acquires, as parameters, a supplied refrigerant temperature $T_{ri}$, a supplied refrigerant flow volume F, a discharged refrigerant temperature $T_{ro}$, discharged refrigerant pressure p, and power consumption P.

Next, the management device 10-4 calculates a heat extraction amount E by executing heat extraction amount calculation processing (step S42). The heat extraction amount calculation processing is as described by use of FIG. 12.

Next, the management device 10-4 calculates an air volume V by executing air volume calculation processing (step S43). The air volume calculation processing is as described by use of FIG. 13.

Next, the management device 10-4 calculates a difference (temperature rise value DT) between an exhaust air temperature $T_o$ and an intake air temperature $T_i$ of the heating element 100 by executing temperature difference calculation processing (step S44). The temperature difference calculation processing is as described by use of FIG. 19.

Next, the management device 10-4 generates a control signal for setting the air conditioning device 30 to the air volume V by executing air conditioning control processing (step S45). The air conditioning control processing will be described later by use of FIG. 24.

Then, the management device 10-4 outputs the control signal to the air conditioning device 30 (step S46).

Figure 24:
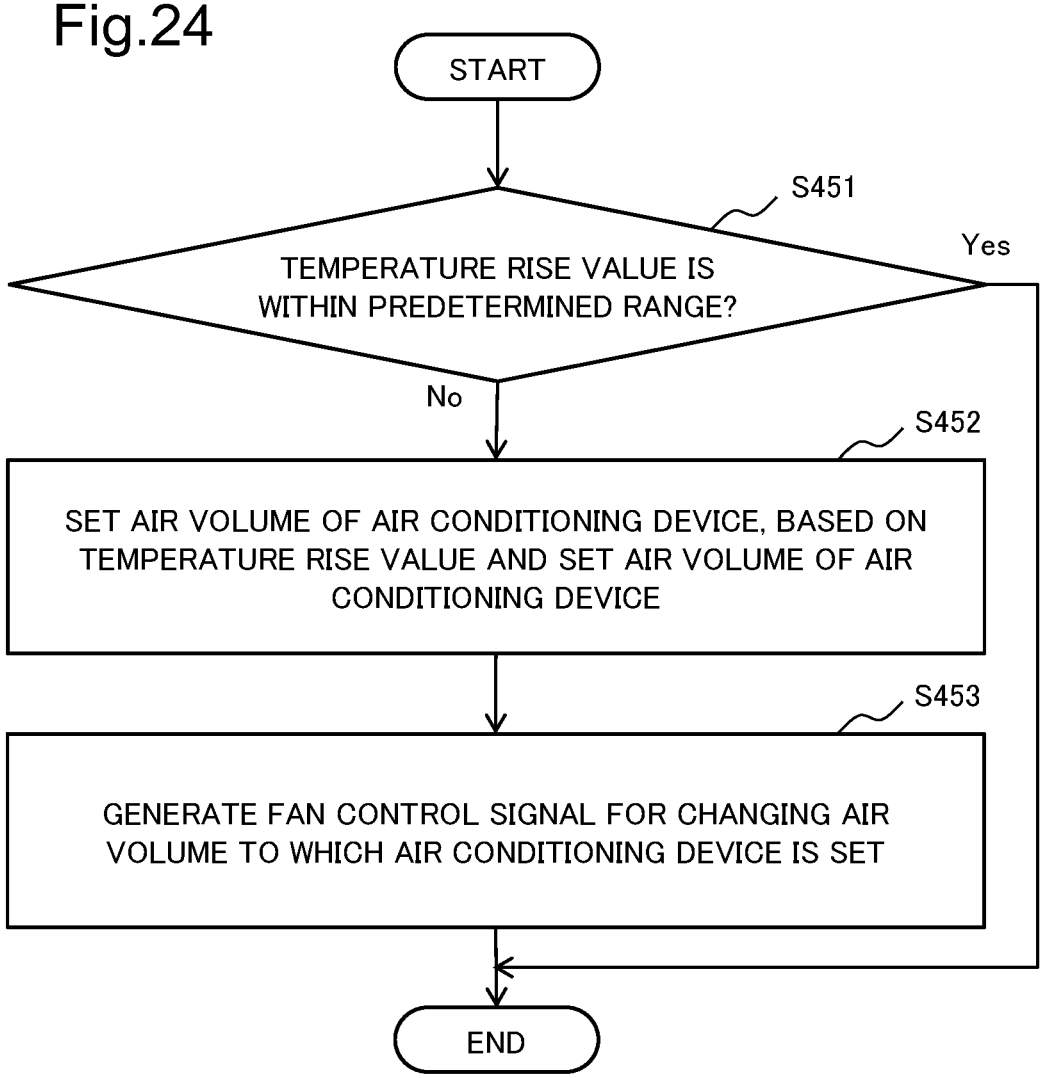
FIG. 24 is a flowchart relating to air conditioning control processing by an air conditioning control unit of the management device of the cooling system according to the fourth example embodiment of the present invention.

Next, the air conditioning control processing in the step S45 of the flowchart of FIG. 23 is described. FIG. 24 is a flowchart for describing the air conditioning control processing.

Air Conditioning Control Processing

In FIG. 24, first, the air conditioning control unit 17 determines whether or not the temperature rise value DT calculated by the temperature difference calculation unit 16 is within a predetermined range (step S451).

When the temperature rise value DT is not within the predetermined range (No in the step S451), the air conditioning control unit 17 sets an air volume V, based on the temperature rise value DT and a set air volume of an air conditioning device (step S452). On the other hand, when the temperature rise value DT is within the predetermined range in the step S451 (Yes in the step S451), the processing along the flowchart in FIG. 24 is finished. Note that the air conditioning control unit 17 may set in such a way as to decrease an air volume by a predetermined volume when the temperature rise value DT is less than or equal to a predetermined temperature difference, and increase an air volume by a predetermined volume when the temperature rise value DT is more than the predetermined temperature difference.

Then, the air conditioning control unit 17 generates a control signal for instructing to change a control condition of the air conditioning device 30 (step S453).

The above is a description regarding the operation of the management device 10-4 according to the present example embodiment. For example, an operation period of the management device 10 is set to a time interval sufficient for a heat transfer in a room where a heating element 100 is placed, and operations of the cooling device 20 and the air conditioning device 30 to become a steady state. Moreover, the management device 10 may be set in such a way as to operate at a predetermined timing, or may be set in such a way as to operate in response to a running instruction of a manager.

As described above, the present example embodiment is able to automatically control an air conditioning device, in addition to being able to calculate an air volume of air supplied to a cooling device, and a temperature difference between an exhaust air temperature and a refrigerant temperature. Thus, the present example embodiment is able to automatically control a temperature in a room where a heating element is placed, without intervention of determination of a manager.

Fifth Example Embodiment

Next, a cooling system according to a fifth example embodiment of the present invention is described. The cooling system according to the present example embodiment relates to an example in which a server system constituted of a plurality of server racks is regarded as a heating element.

Figure 25:
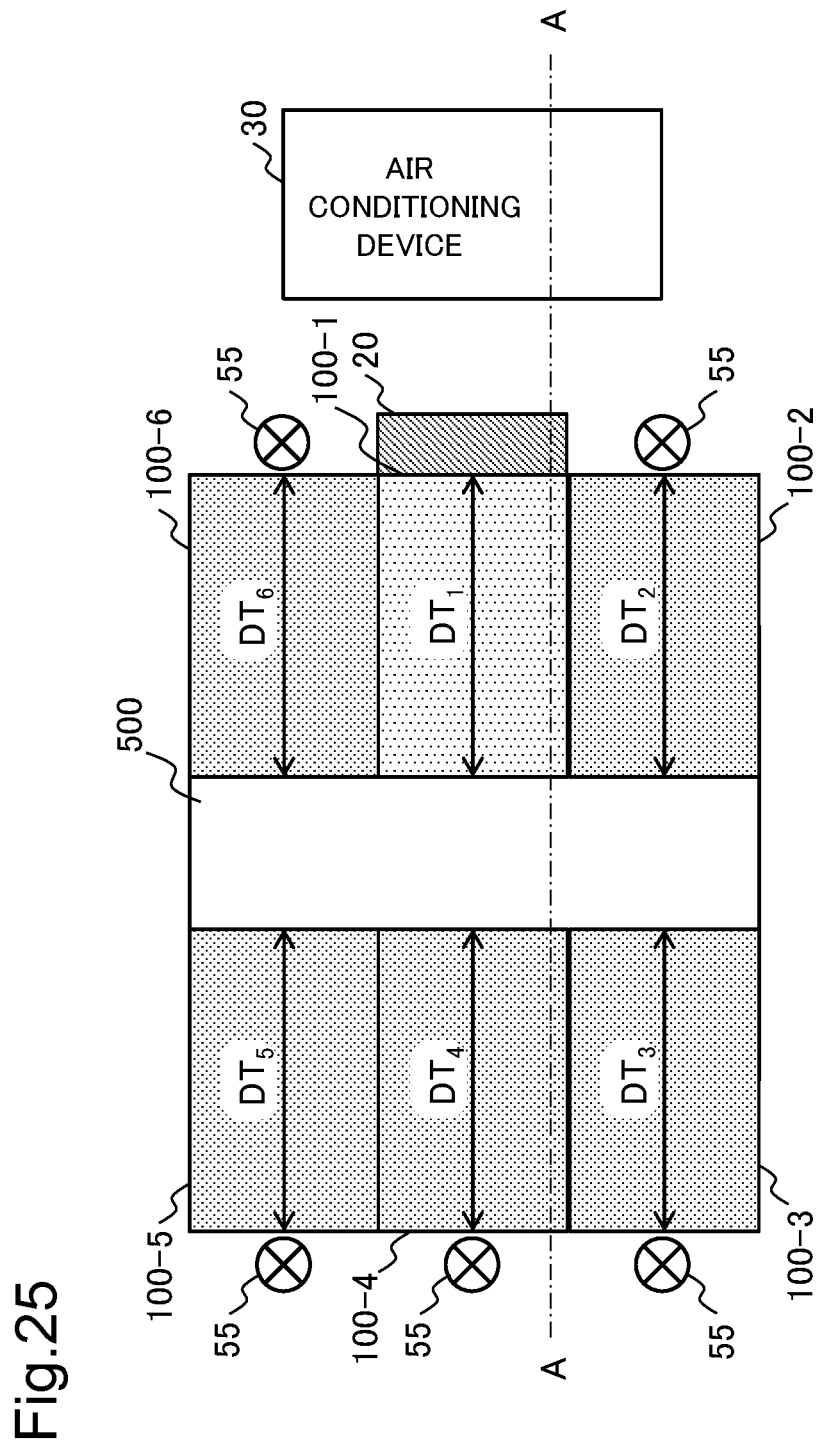
FIG. 25 is a top view illustrating a disposition example of a heating element of a cooling system according to a fifth example embodiment of the present invention.
Figure 26:
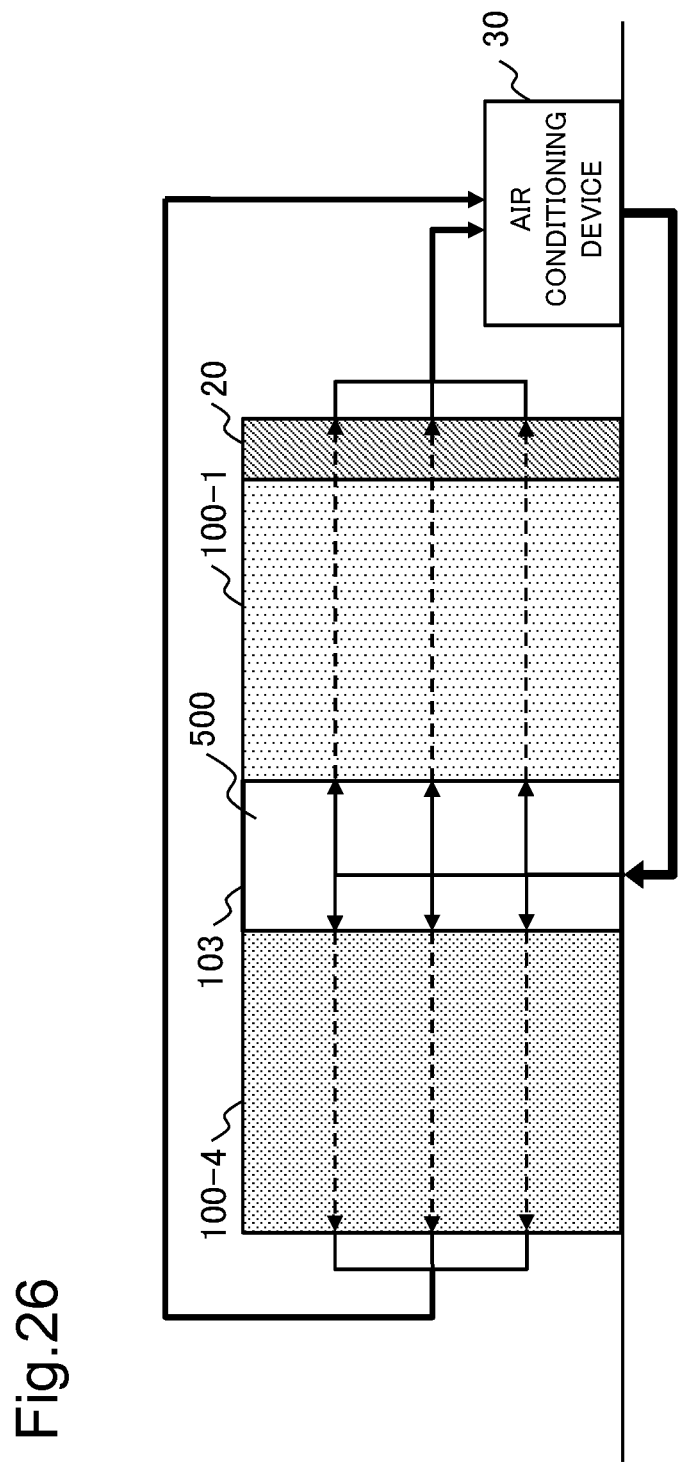
FIG. 26 is a sectional view cut along a line A-A in FIG. 25.
Figure 27:
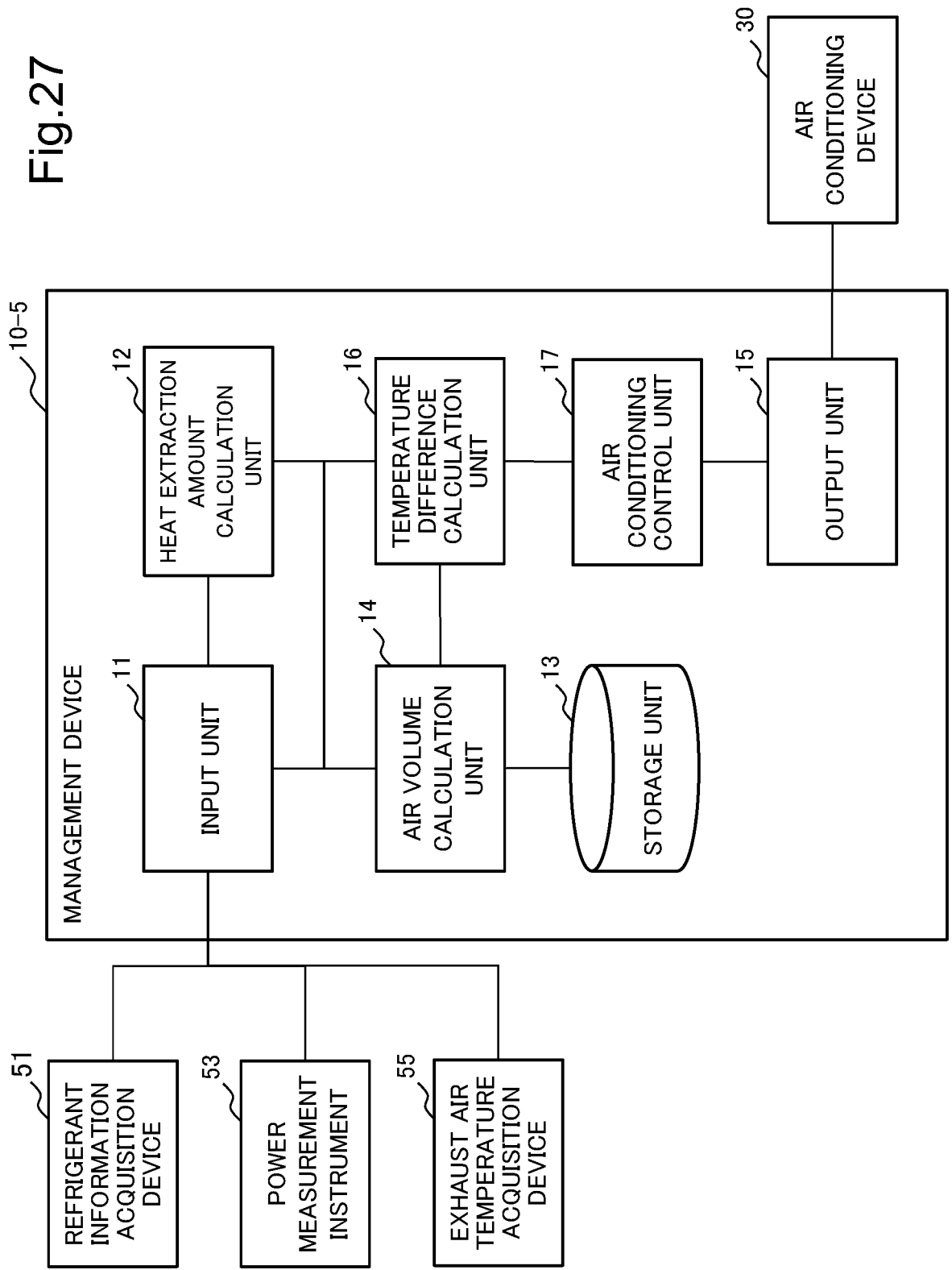
FIG. 27 is a block diagram illustrating an example of connection between a management device of the cooling system according to the fifth example embodiment of the present invention and peripheral equipment.

FIG. 25 is a top view of a conceptual diagram of the server system constituted of the plurality of server racks. FIG. 26 is a sectional view cut along a line A-A in FIG. 25. FIG. 27 is a block diagram illustrating a configuration of a management device 10-5 of the cooling system according to the present example embodiment, and a state of connection between the management device 10-5 and peripheral devices.

As in FIG. 25, the server system has a configuration combining a server rack (a heating element 100-1) on which a cooling device 20 is placed, and server racks (heating elements 100-2 to 6) on which the cooling device 20 is not placed. In the example of FIG. 25, a cold aisle 500 which introduces air blown from an air conditioning device 30 is formed on an intake side of each of the heating elements 100-1 to 6, and a hot aisle is formed on an exhaust side. Hereinafter, when not being distinguished from one another, the heating element 100-1 and the heating elements 100-2 to 6 are denoted as a heating element 100.

The cooling device 20 is placed on the exhaust side of the heating element 100-1 (also referred to as a first heating element), as in one of the first to fourth example embodiments. On the other hand, the cooling device 20 is not placed on the exhaust side of each of the heating elements 100-2 to 6 (also referred to as a second heating element), and an exhaust air temperature acquisition device 55 for measuring an exhaust air temperature $T_O$ is placed.

The exhaust air temperature acquisition device 55 is disposed on the exhaust side of each of the heating elements 100-2 to 6, and measures a temperature (hereinafter, the exhaust air temperature $T_O$) of exhaust air discharged from each of the heating elements 100-2 to 6. The exhaust air temperature acquisition device 55 outputs the measured exhaust air temperature $T_O$ to the management device 10-5 (FIG. 27).

As in FIG. 26, air supplied to the cold aisle 500 is let into the intake side of each of the heating elements 100-1 to 6, by blocking opposed top surfaces of the heating elements 100 with an aisle cap 103. An arrow indicated in FIG. 26 is a conceptual diagram of a situation where air blown from the air conditioning device 30 circulates. Air blown from the air conditioning device 30 is supplied to the cold aisle 500 under a floor or the like, and introduced to the heating element 100. Then, the air introduced to the heating element 100 is warmed inside the heating element 100, and then discharged to the hot aisle. The air discharged from the heating element 100 is again returned to the air conditioning device 30 through the hot aisle, adjusted a temperature in the air conditioning device 30, and then again blown toward the cold aisle 500.

Configuration

As in FIG. 27, the present example embodiment is different from the fourth example embodiment in that an input unit 11 of the management device 10-5 is connected to the exhaust air temperature acquisition device 55. Moreover, the management device 10-5 is different from that according to the fourth example embodiment in that a temperature difference calculation unit 16 calculates, as a temperature rise value DT, a difference between the exhaust air temperature $T_O$ and the intake air temperature $T_i$ (an air conditioning set temperature $T_{sa}$) of each of the heating elements 100-2 to 6 acquired by the exhaust air temperature acquisition device 55.

Figure 28:
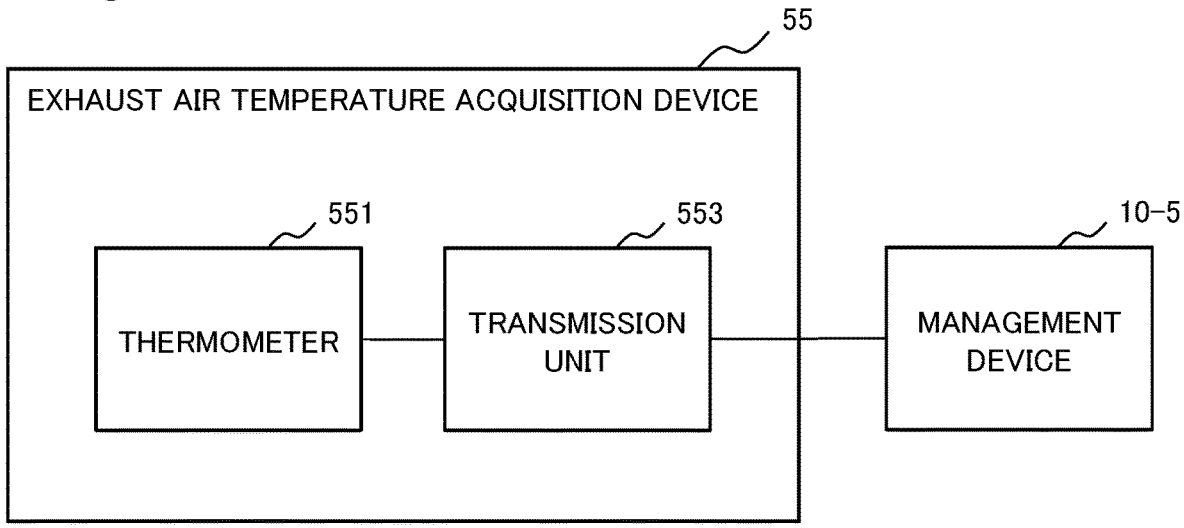
FIG. 28 is a block diagram illustrating a configuration of an exhaust air temperature acquisition device connected to the management device of the cooling system according to the fifth example embodiment of the present invention.

FIG. 28 is a block diagram illustrating a configuration of the exhaust air temperature acquisition device 55. As in FIG. 28, the exhaust air temperature acquisition device 55 includes a thermometer 551 and a transmission unit 553. The thermometer 551 is placed on the exhaust side of each of the heating elements 100-2 to 6. The thermometer 551 measures the exhaust air temperature $T_O$ of each of the heating elements 100-2 to 6. For example, the thermometer 551 can be achieved by a thermocouple, a resistance thermometer, a contactless thermometer, or the like. The thermometer 551 outputs the measured exhaust air temperature $T_O$ to the transmission unit 553. The transmission unit 553 acquires the exhaust air temperature $T_O$ from the thermometer 551, and transmits the acquired exhaust air temperature $T_O$ to the management device 10-5.

Figure 29:
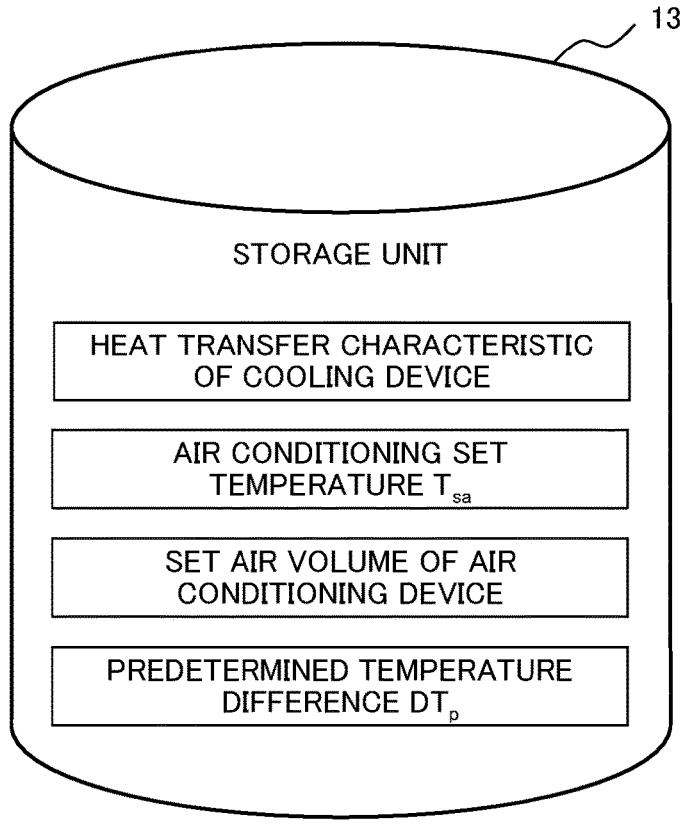
FIG. 29 is a conceptual diagram illustrating an information example stored in a storage unit of the management device of the cooling system according to the fifth example embodiment of the present invention.

FIG. 29 is a conceptual diagram illustrating information stored in a storage unit 13. As in FIG. 29, the storage unit 13 stores a heat transfer characteristic of the cooling device 20, an air conditioning set temperature $T_{sa}$, a set air volume of the air conditioning device 30, and a predetermined temperature difference $DT_p$.

The input unit 11 is connected to the exhaust air temperature acquisition device 55, in addition to a refrigerant information acquisition device 51 and a power measurement instrument 53 (FIG. 27). The input unit 11 acquires a supplied refrigerant temperature $T_{ri}$, a supplied refrigerant flow volume F, a discharged refrigerant temperature $T_{ro}$, and discharged refrigerant pressure p from the refrigerant information acquisition device 51, and acquires power consumption P of each of the heating elements 100-1 to 6 from the power measurement instrument 53. The input unit 11 also acquires the exhaust air temperature $T_O$ of each of the heating elements 100-2 to 6 from the exhaust air temperature acquisition device 55.

The input unit 11 outputs the supplied refrigerant temperature $T_{ri}$, the supplied refrigerant flow volume F, the discharged refrigerant temperature $T_{ro}$, the discharged refrigerant pressure p, the power consumption P, and the exhaust air temperature $T_O$ to the heat extraction amount calculation unit 12. Moreover, the input unit 11 outputs the exhaust air temperature $T_O$ to the temperature difference calculation unit 16. Note that the input unit 11 may directly output the supplied refrigerant temperature $T_{ri}$, the supplied refrigerant flow volume F, the discharged refrigerant temperature $T_{ro}$, and the discharged refrigerant pressure p to an air volume calculation unit 14. Moreover, information relating to a power value (power consumption P) measured by the power measurement instrument 53 may be replaced by a total of power values collected by use of information communication from the heating elements 100-1 to 6.

The temperature difference calculation unit 16 acquires an air volume V calculated by the air volume calculation unit 14 in relation to the heating element 100-1, and calculates a temperature rise value $DT_1$ being a difference between the exhaust air temperature $T_O$ and the intake air temperature $T_i$ (the air conditioning set temperature $T_{sa}$). Moreover, the temperature difference calculation unit 16 acquires the exhaust air temperature $T_O$ of each of the heating elements 100-2 to 6 from the input unit 11, and calculates each of temperature rise values $DT_2$ to $DT_6$ being a difference between an exhaust air temperature and the intake air temperature $T_i$ of each of the heating elements 100-2 to 6. The temperature difference calculation unit 16 outputs the calculated temperature rise values $DT_1$ to $DT_6$ to an air conditioning control unit 17. Hereinafter, when described without being distinguished from one another, the temperature rise values $T_1$ to $DT_6$ are denoted as a temperature rise value DT.

The air conditioning control unit 17 acquires the temperature rise value DT from the temperature difference calculation unit 16, and controls the air conditioning device 30, based on the acquired temperature rise value DT. The air conditioning control unit 17 acquires a set air volume of the air conditioning device 30 stored in the storage unit 13 and the predetermined temperature difference $DT_p$, and generates a control signal for controlling the air conditioning device 30, based on the temperature rise value DT, the predetermined temperature difference $DT_p$, and the set air volume of the air conditioning device 30. Then, the air conditioning control unit 17 generates a control signal for controlling the air conditioning device 30, and outputs the generated control signal to an output unit 15.

Operation

Figure 30:
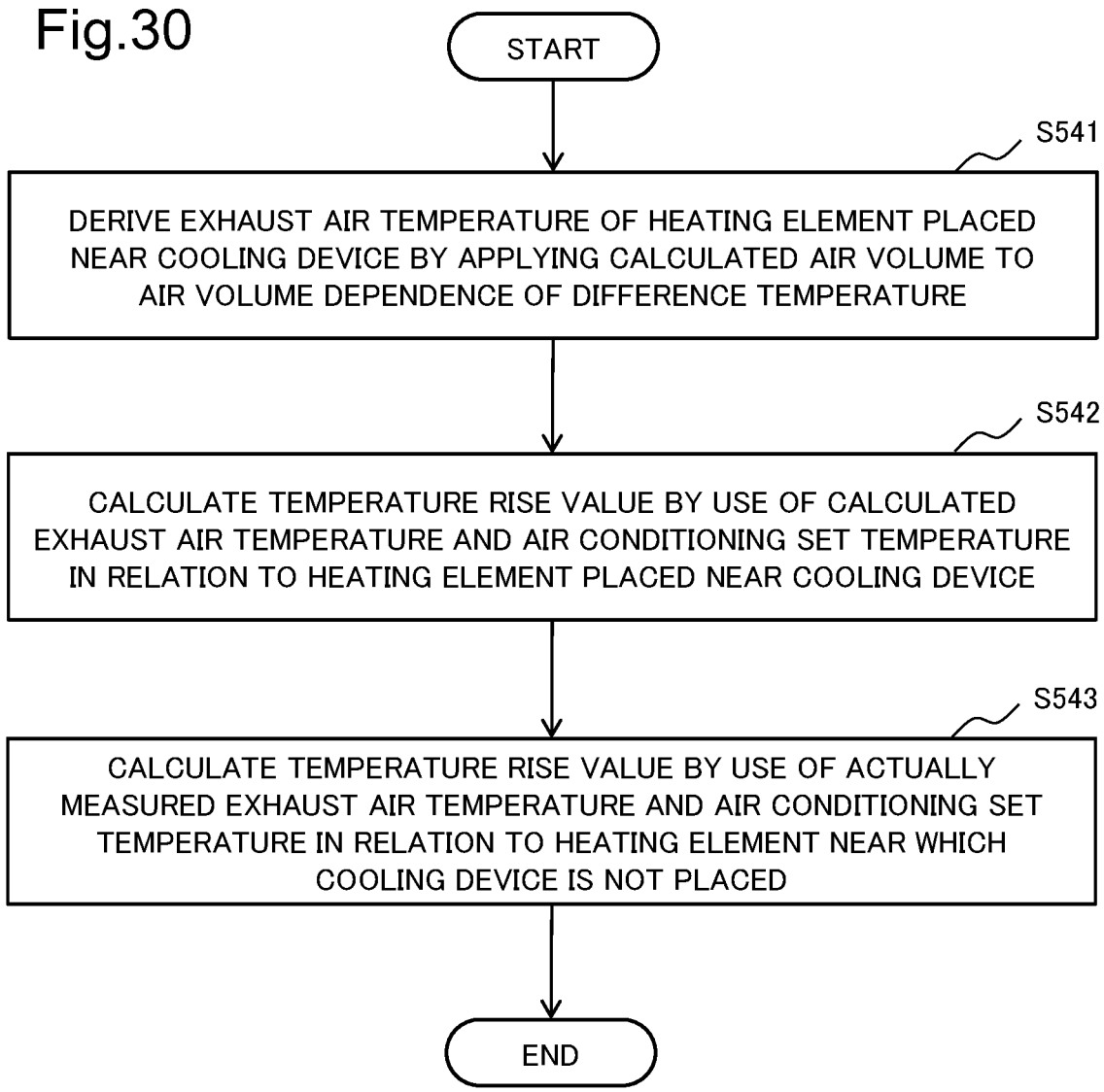
FIG. 30 is a flowchart relating to temperature difference calculation processing of the management device of the cooling system according to the fifth example embodiment of the present invention.

Next, an operation of the cooling system according to the present example embodiment is described with reference to the drawings. FIG. 30 is a flowchart for describing an operation of the cooling system according to the present example embodiment.

In FIG. 30, first, the temperature difference calculation unit 16 derives the exhaust air temperature $T_O$ by use of an air volume V calculated by the air volume calculation unit 14, and air volume dependence of a difference temperature dT of the cooling device 20, in relation to the heating element 100-1 near which the cooling device 20 is placed (step S541).

Next, the temperature difference calculation unit 16 calculates a temperature rise value DT in the heating element 100-1 near which the cooling device 20 is placed, by use of the calculated exhaust air temperature $T_O$ of the heating element 100-1, and the air conditioning set temperature $T_{sa}$ (step S542).

Then, the temperature difference calculation unit 16 calculates, as a temperature rise value DT, a difference between the measured exhaust air temperature $T_O$ and the air conditioning set temperature $T_{sa}$, in relation to each of the heating elements 100-2 to 6 near which the cooling device 20 is not placed (step S543).

Air Conditioning Control

Herein, one example of controlling the air conditioning device 30 by the air conditioning control unit 17 of the management device 10-5 in the cooling system according to the present example embodiment is described.

Figure 31:
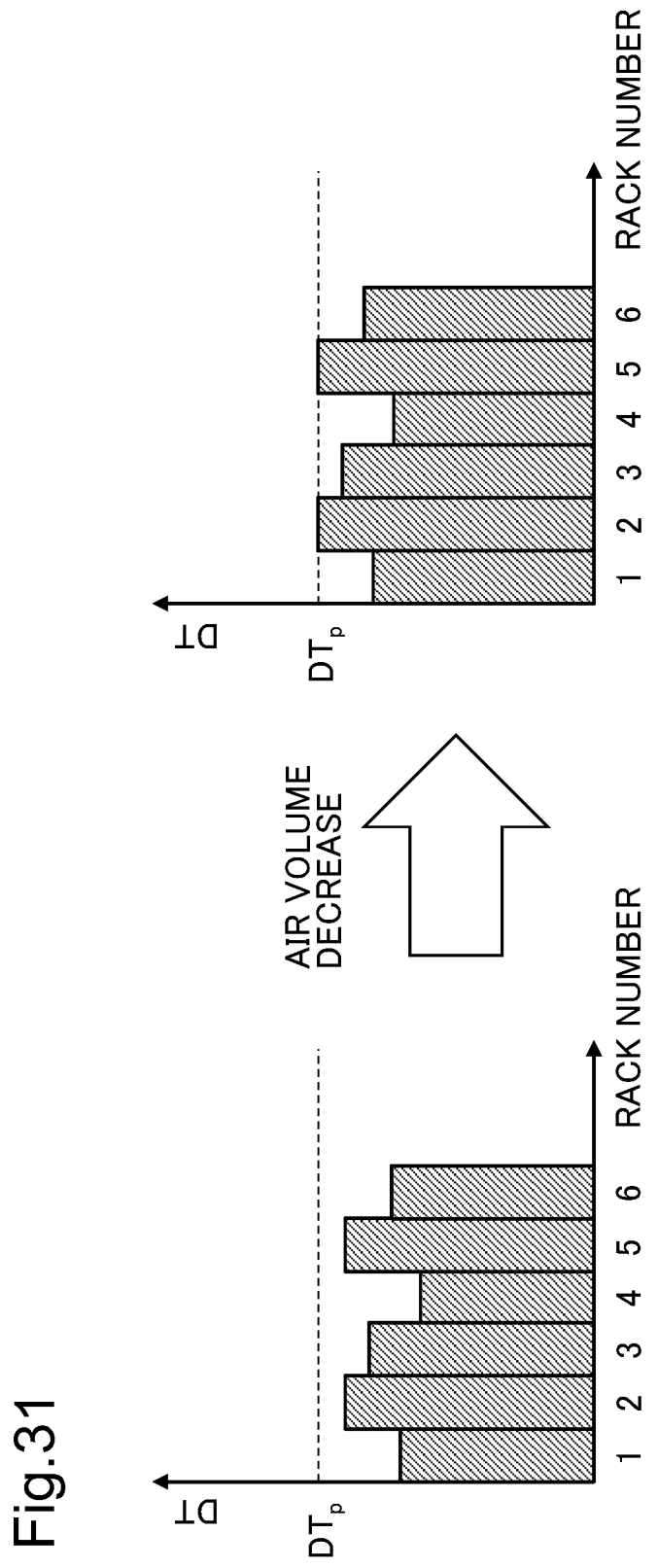
FIG. 31 is a control example based on a condition set by an air conditioning control unit of the management device of the cooling system according to the fifth example embodiment of the present invention.
Figure 32:
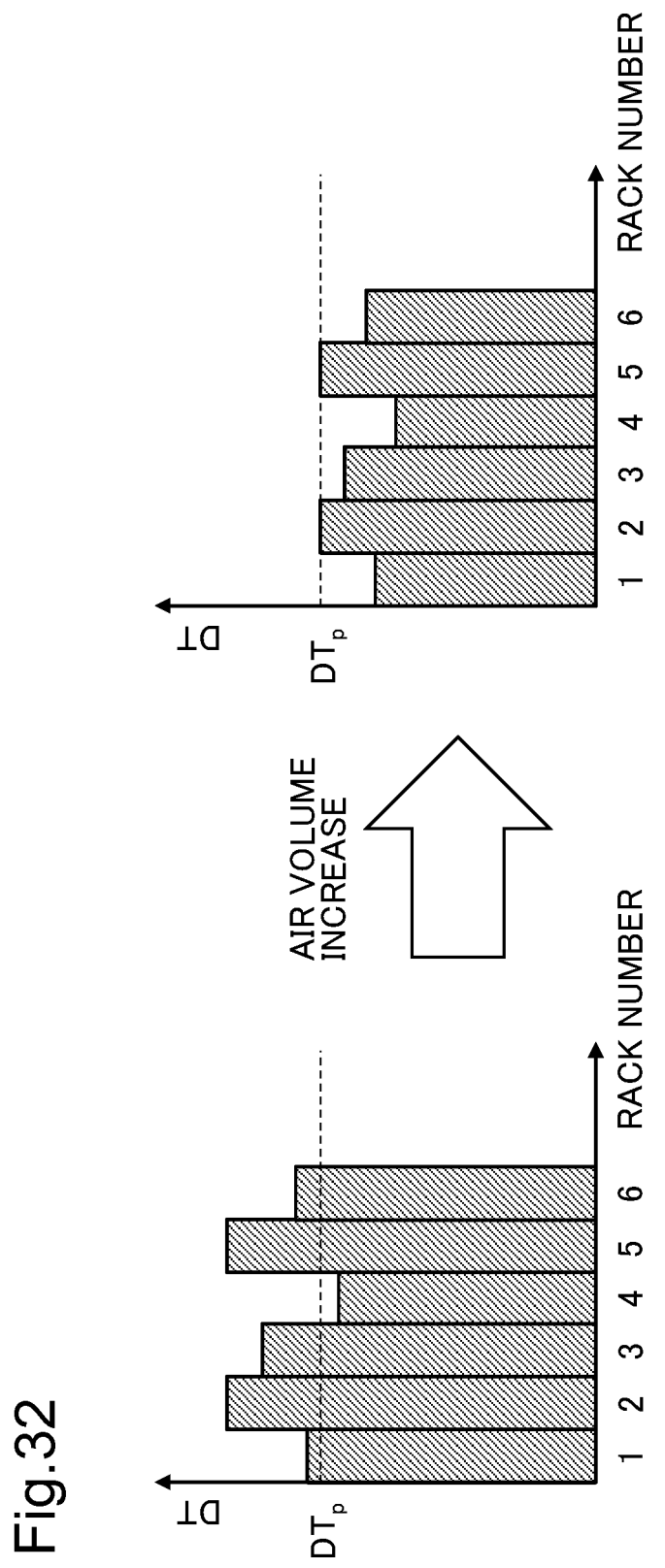
FIG. 32 is a control example based on a condition set by the air conditioning control unit of the management device of the cooling system according to the fifth example embodiment of the present invention.

Each of FIGS. 31 and 32 is a conceptual diagram for describing one example of air conditioning control in the present example embodiment. In the example of each of FIGS. 31 and 32, the air conditioning control unit 17 controls the air conditioning device 30 in such a way as to bring a maximum value of the temperature rise value DT of each of the heating elements 100 to the predetermined temperature difference $DT_p$. For example, the air conditioning control unit 17 outputs, to the output unit 15, a control signal for setting the air conditioning device 30 to a condition in which a fan rotation number is changed by 5% of rating. Note that any change condition of a fan rotation number is assumed to be settable.

FIG. 31 is a case where a maximum value of the temperature rise value DT relating to each of the heating elements 100 is less than the predetermined temperature difference $DT_p$. In this case, the air conditioning control unit 17 outputs, to the output unit 15, a control signal for setting the air conditioning device 30 to a condition in which a fan rotation number is decreased by 5% (a predetermined amount) of rating.

FIG. 32 is a case where a maximum value of the temperature rise value DT relating to each of the heating elements 100 is more than the predetermined temperature difference $DT_p$. In this case, the air conditioning control unit 17 outputs, to the output unit 15, a control signal for setting the air conditioning device 30 to a condition in which a fan rotation number is increased by 5% (a predetermined amount) of rating.

Figure 33:
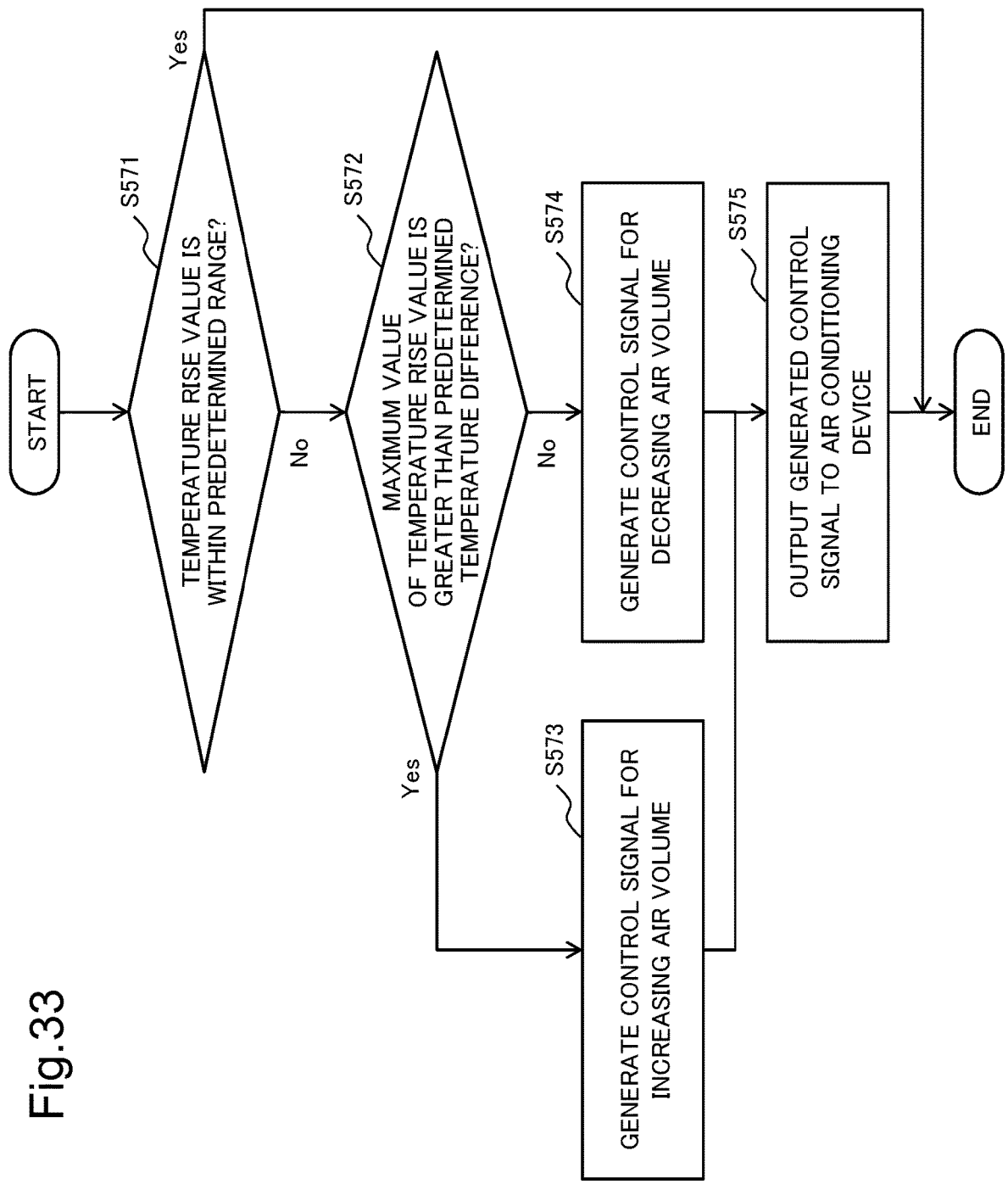
FIG. 33 is a flowchart illustrating a control example based on a condition set by the air conditioning control unit of the management device of the cooling system according to the fifth example embodiment of the present invention.

FIG. 33 is a flowchart summarizing a flow of processing in each of FIGS. 31 and 32. Note that a description is given assuming that an agent of an operation in FIG. 33 is the management device 10-5.

In FIG. 33, first, the management device 10-5 determines whether or not the temperature rise value DT is within an allowable range (step S571). Note that an allowable range of the temperature rise value DT may be preset. When the temperature rise value DT is within the allowable range (Yes in the step S571), the management device 10-5 finishes the processing along the flowchart in FIG. 33 without generating a control signal.

On the other hand, when the temperature rise value DT is out of the allowable range (No in the step S571), the management device 10-5 determines a magnitude relation between a maximum value of the temperature rise value DT and the predetermined temperature difference $DT_p$ (step S572). Note that, when a maximum value of the temperature rise value DT and the predetermined temperature difference $DT_p$ are equal to each other, it is assumed that the temperature rise value DT is determined to be within the allowable range in the determination of the step S571.

When a maximum value of the temperature rise value DT is more than the predetermined temperature difference $DT_p$ (Yes in the step S572), the management device 10-5 generates a control signal for increasing an air volume V of air supplied from the air conditioning device 30 (step S573). On the other hand, when a maximum value of the temperature rise value DT is less than the predetermined temperature difference $DT_p$ (No in the step S572), the management device 10-5 generates a control signal for decreasing an air volume V of air supplied from the air conditioning device 30 (step S574).

Then, the management device 10-5 outputs the generated control signal to the air conditioning device 30. The processing along the flowchart in FIG. 33 enables to automatically control the air conditioning device 30 according to the air volume V of air supplied to the cooling device 20.

The air conditioning control in FIGS. 31 to 33 is able to suppress a variation of the temperature rise value DT of air supplied to the heating elements 100. Thus, the air conditioning control in FIGS. 31 to 33 makes it easier to set a temperature in a room into an appropriate range, in an environment where the heating element 100 in which the cooling device 20 is placed and the heating element 100 in which the cooling device 20 is not placed are mixed. In other words, the air conditioning control in FIGS. 31 to 33 enables to appropriately cool each of the heating elements 100, and reduce overall power consumption.

For example, when a calculated temperature rise value DT is 8° C., and a predetermined temperature difference $DT_p$ is 10° C., the air volume V is excessive, and therefore, the power consumption P of the air conditioning device 30 can be reduced by lessening a fan rotation number of the air conditioning device 30. Moreover, for example, when a calculated temperature rise value DT is 12° C., and a predetermined temperature difference $DT_p$ is 10° C., the air volume V is insufficient, and therefore, an operation environment of a heating element can be improved by increasing a fan rotation number of the air conditioning device 30.

As described above, according to the present example embodiment, in an environment where a heating element in which a cooling device is placed and a heating element in which a cooling device is not placed are provided together, an operation environment of a plurality of heating elements can be optimized by automatically controlling an air volume of air supplied to the plurality of the heating elements.

Hardware

Figure 34:
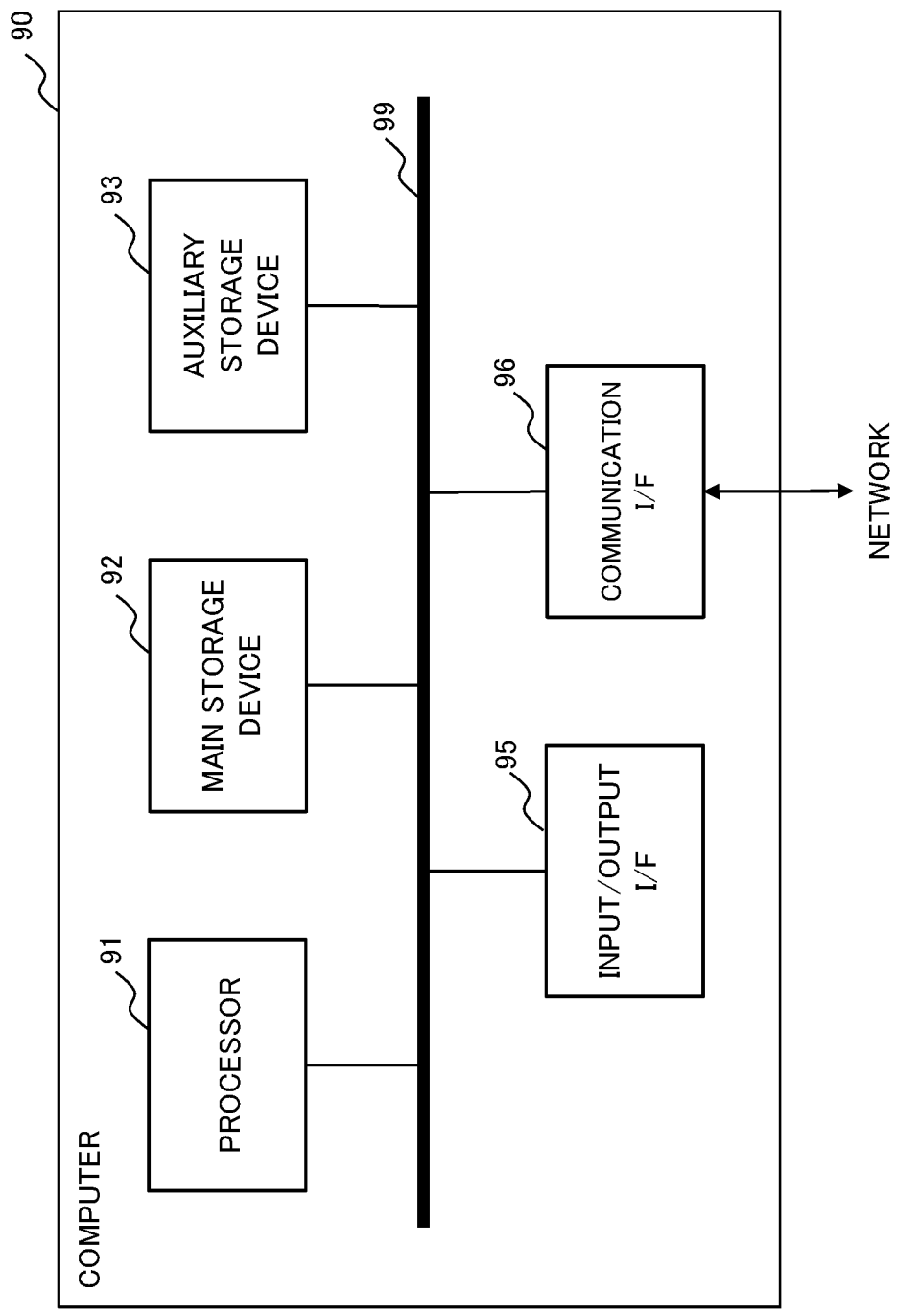
FIG. 34 is a block diagram illustrating a hardware configuration example which achieves the management device of the cooling system according to each example embodiment of the present invention.

Herein, a hardware configuration which executes arithmetic processing and control processing of a management device according to the present example embodiment is described by citing a computer 90 in FIG. 34 as one example. Note that the computer 90 in FIG. 34 is a configuration example for achieving a control system of the management device according to each example embodiment, and does not limit the scope of the present invention. Moreover, the management device according to the present example embodiment does not have to include all the components illustrated in FIG. 34, and may include a component which is not illustrated in FIG. 34.

As in FIG. 34, the computer 90 includes a processor 91, a main storage device 92, an auxiliary storage device 93, an input/output interface 95, and a communication interface 96. In FIG. 34, an interface is abbreviated as "I/F". The processor 91, the main storage device 92, the auxiliary storage device 93, the input/output interface 95, and the communication interface 96 are data-communicably connected to each other via a bus 99. Moreover, the processor 91, the main storage device 92, the auxiliary storage device 93, and the input/output interface 95 are connected to a network such as the Internet or an intranet via the communication interface 96.

The processor 91 develops, in the main storage device 92, a program stored in the auxiliary storage device 93 or the like, and executes the developed program. In each example embodiment of the present invention, a configuration using a software program installed in the computer 90 may be provided. The processor 91 executes the arithmetic processing and the control processing by the management device according to the present example embodiment.

The main storage device 92 has an area where a program is developed. The main storage device 92 can be achieved by a volatile memory such as a dynamic random access memory (DRAM), or a non-volatile memory such as a magnetoresistive random access memory (MRAM).

The auxiliary storage device 93 stores various data. The auxiliary storage device 93 is configured by a local disk such as a hard disk or a flash memory. Note that the main storage device 92 may be configured to store various data, and the auxiliary storage device 93 may be omitted.

The input/output interface 95 connects the computer 90 and peripheral equipment, based on a connection standard of the computer 90 and the peripheral equipment. The communication interface 96 is connected to a network such as the Internet or an intranet, based on a standard or a specification. The input/output interface 95 and the communication interface 96 may be formed into a common interface as an interface which is connected to external equipment.

Furthermore, the computer 90 may be configured such that input equipment such as a keyboard, a mouse, and a touch panel can be connected to the computer 90 according to need. The input equipment is used for input of information and setting. When a touch panel is used as input equipment, a display screen of display equipment may be configured to double as an interface of the input equipment. Data communication between the processor 91 and input equipment is mediated by the input/output interface 95. Additionally, the computer 90 may be equipped with display equipment for displaying image information. The display equipment is connected to the computer 90 via the input/output interface 95.

The communication interface 96 is connected to an external system or device through a network. The communication interface 96 may be provided with a function of performing wireless communication, and configured in such a way as to transmit and receive various data by wireless communication.

Furthermore, the computer 90 may be equipped with a reader/writer according to need. The reader/writer is connected to the bus 99. Between the processor 91 and a non-illustrated recording medium (program recording medium), the reader/writer mediates reading of a data/program from the recording medium, writing of a processing result of the computer 90 into the recording medium, and the like. The recording medium can be achieved by a semiconductor recording medium such as a universal serial bus (USB) memory and a secure digital (SD) card. Additionally, the recording medium can also be achieved by a magnetic recording medium such as a flexible disc, an optical recording medium such as a compact disc (CD) or a digital versatile disc (DVD), or another recording medium.

The above is one example of the hardware configuration for enabling the management device according to each example embodiment of the present invention.

At least one of elements configuring the management device according to each example embodiment of the present invention is achieved by the computer 90 in FIG. 34. For example, an element configuring the management device according to each example embodiment of the present invention can be achieved by software operating on the computer 90 in FIG. 34. Additionally, an element configuring the management device according to each example embodiment of the present invention may be achieved by a circuit having a function of each component.

Furthermore, a program which causes a computer to execute processing by the management device according to each example embodiment of the present invention also falls within the scope of the present invention. Moreover, a program recording medium recording a program according to each example embodiment of the present invention also falls within the scope of the present invention.

While the present invention has been described above with reference to the example embodiments, the present invention is not limited to the above-described example embodiments. Various changes which can be understood by a person skilled in the art can be made to a configuration and details of the present invention within the scope of the present invention.

SUPPLEMENTARY NOTE

Some or all of the above-described example embodiments can be also described as, but are not limited to, the following supplementary notes.

Supplementary Note 1

A management device including:

a storage unit which stores a known intake air temperature of a heating element, and a heat transfer characteristic of a cooling device being placed near the heating element and cooling exhaust air from the heating element;

an input unit which inputs refrigerant information of a refrigerant used in the cooling device, and power consumption of the heating element;

a heat extraction amount calculation unit which calculates a heat extraction amount of the cooling device, by use of the refrigerant information input by the input unit, and a cooling capacity of the refrigerant;

an air volume calculation unit which calculates an air volume of air supplied to the cooling device, by applying the heat extraction amount to air volume dependence of the heat extraction amount, being derived by use of air volume dependence of a difference temperature between a temperature of the refrigerant and a temperature of exhaust air from the heating element, and the heat transfer characteristic, the air volume dependence of the difference temperature being derived by use of the intake air temperature, the power consumption, and the refrigerant information; and an output unit which outputs data relating to an air volume calculated by the air volume calculation unit.

Supplementary Note 2

The management device according to supplementary note 1, wherein the input unit acquires, as the refrigerant information, a supplied refrigerant temperature being a temperature of the refrigerant supplied to the cooling device, a supplied refrigerant flow volume being a flow volume of the refrigerant supplied to the cooling device, a discharged refrigerant temperature being a temperature of the refrigerant discharged from the cooling device, and discharged refrigerant pressure being pressure of the refrigerant discharged from the cooling device.

Supplementary Note 3

The management device according to supplementary note 2, wherein the heat extraction amount calculation unit calculates the heat extraction amount by use of the cooling capacity derived by applying the supplied refrigerant temperature, the discharged refrigerant temperature, and the discharged refrigerant pressure to a relation between a heat amount and pressure of the refrigerant.

Supplementary Note 4

The management device according to supplementary note 2 or 3, wherein
in relation to a Mollier diagram indicating a relation between a heat amount and pressure of the refrigerant, the heat extraction amount calculation unit derives, as the cooling capacity, a difference between a first specific enthalpy at an intersection point of an isothermal line after inflation of supercooled liquid based on the supplied refrigerant temperature and an isobaric line of heating steam based on the discharged refrigerant pressure, and a second specific enthalpy at an intersection point of an isothermal line of heating steam based on the discharged refrigerant temperature and the isobaric line.

Supplementary Note 5

The management device according to any one of supplementary notes 2 to 4, wherein
the heat extraction amount calculation unit calculates the heat extraction amount by integrating the cooling capacity of the cooling device with flux of the refrigerant.

Supplementary Note 6

The management device according to any one of supplementary notes 2 to 5, wherein
the storage unit stores, as the heat transfer characteristic, a characteristic associating an air volume of air supplied to the cooling device with thermal conductance of the cooling device.

Supplementary Note 7

The management device according to any one of supplementary notes 2 to 6, wherein
the air volume calculation unit uses, as air volume dependence of the difference temperature, a characteristic associating an air volume of air supplied to the cooling device with a difference between an exhaust air temperature of the heating element and the supplied refrigerant temperature.

Supplementary Note 8

The management device according to supplementary note 7, further including
a temperature difference calculation unit which derives the exhaust air temperature of the heating element by applying an air volume calculated by the air volume calculation unit to air volume dependence of the difference temperature, and calculates, as a temperature rise value, a difference between the exhaust air temperature and the intake air temperature.

Supplementary Note 9

The management device according to supplementary note 8, further including
an air conditioning control unit which controls an air conditioning device which adjusts a temperature inside of a room where the heating element is disposed to the intake air temperature, wherein the air conditioning control unit controls the air conditioning device, based on the temperature rise value calculated by the temperature difference calculation unit.

Supplementary Note 10

The management device according to supplementary note 9, wherein
the storage unit stores a set air volume of the air conditioning device,
the air conditioning control unit refers to the set air volume, and generates a control signal for controlling the air conditioning device, based on the temperature rise value, and
the output unit transmits the control signal generated by the air conditioning control unit to the air conditioning device.

Supplementary Note 11

The management device according to supplementary note 10, wherein, in a system where at least one first heating element in which the cooling device is placed and at least one second heating element in which the cooling device is not placed are provided together,
the input unit acquires the exhaust air temperature of the second heating element,
the temperature difference calculation unit calculates, in relation to the first heating element, as the temperature rise value, a difference between the exhaust air temperature and the intake air temperature, the exhaust air temperature being calculated by applying an air volume calculated by the air volume calculation unit to air volume dependence of the difference temperature, and
calculates, in relation to the second heating element, as the temperature rise value, a difference between the exhaust air temperature of the second heating element acquired by the input unit and the intake air temperature, and
the air conditioning control unit sets an air volume of the air conditioning device, based on the temperature rise value calculated in relation to at least either one of the first heating element or the second heating element.

Supplementary Note 12

The management device according to supplementary note 11, wherein
the storage unit stores a predetermined temperature difference, and
the air conditioning control unit controls the air conditioning device, based on a relation between the temperature rise value calculated in relation to at least either one of the first heating element or the second heating element, and the predetermined temperature difference.

Supplementary Note 13

The management device according to supplementary note 12, wherein
the air conditioning control unit increases an air volume of the air conditioning device when a maximum value of the temperature rise value calculated in relation to the first heating element and the second heating element is smaller than the predetermined temperature difference, and
decreases an air volume of the air conditioning device when a maximum value of the temperature rise value calculated in relation to the first heating element and the second heating element is greater than the predetermined temperature difference.

Supplementary Note 14

The management device according to supplementary note 12 or 13, further including
a display device which displays an output of the output unit, wherein
the display device displays display information including a display part which displays an air volume of air supplied to the cooling device, an input part for inputting an air volume to which the air conditioning device is set, and an execution button for setting the air conditioning device to an air volume input to the input part.

Supplementary Note 15

The management device according to any one of supplementary notes 1 to 13, further including a display device which displays an output of the output unit.

Supplementary Note 16

A cooling system including:
at least one of the cooling devices; and
the management device according to any one of supplementary notes 1 to 15.

Supplementary Note 17

A cooling system including:
at least one of the cooling devices;
the air conditioning device; and
the management device according to any one of supplementary notes 9 to 14.

Supplementary Note 18

A management method including:
inputting refrigerant information of a refrigerant used in a cooling device, and power consumption of a heating element;
calculating a heat extraction amount by use of the input refrigerant information and a cooling capacity of the refrigerant;
deriving air volume dependence of the heat extraction amount of the cooling device by use of air volume dependence of a difference temperature between a temperature of the refrigerant and a temperature of exhaust air from the heating element, and a heat transfer characteristic of the cooling device, the air volume dependence of the difference temperature being derived by use of a known intake air temperature of the heating element, the power consumption, and the refrigerant information, the cooling device being placed near the heating element and cooling exhaust air from the heating element;
calculating an air volume of air supplied to the cooling device by applying the heat extraction amount to derived air volume dependence of the heat extraction amount; and
outputting data relating to a calculated air volume.

Supplementary Note 19

A program recording medium recording a program which causes a computer to execute:
processing of inputting refrigerant information of a refrigerant used in a cooling device, and power consumption of a heating element;
processing of calculating a heat extraction amount by use of the input refrigerant information and a cooling capacity of the refrigerant;
processing of deriving air volume dependence of the heat extraction amount of the cooling device by use of air volume dependence of a difference temperature between a temperature of the refrigerant and a temperature of exhaust air from the heating element, and a heat transfer characteristic of the cooling device, the air volume dependence of the difference temperature being derived by use of a known intake air temperature of the heating element, the power consumption, and the refrigerant information, the cooling device being placed near the heating element and cooling exhaust air from the heating element;
processing of calculating an air volume of air supplied to the cooling device by applying the heat extraction amount to derived air volume dependence of the heat extraction amount; and
processing of outputting data relating to a calculated air volume.

REFERENCE SIGNS LIST

10 Management device
11 Input unit
12 Heat extraction amount calculation unit
13 Storage unit
14 Air volume calculation unit
15 Output unit
16 Temperature difference calculation unit
17 Air conditioning control unit
20 Cooling device
21 Supply pipe
25 Discharge pipe
30 Air conditioning device
31 Input unit
33 Fan control unit
35 Fan driving unit
37 Fan
51 Refrigerant information acquisition device
53 Power measurement instrument
55 Exhaust air temperature acquisition device
60 Display device
100 Heating element
110 Power source
130 Power line
511 Supplied refrigerant thermometer
512 Supplied refrigerant flowmeter
513 Discharged refrigerant thermometer
514 Discharged refrigerant pressure gauge
515 Transmission unit
531 Power meter
533 Transmission unit
551 Thermometer
553 Transmission unit

The invention claimed is:
1. A management device comprising:
at least one memory storing instructions; and at least one processor connected to the at least one memory and configured to execute the instructions to:
store a known intake air temperature of a heating element, and a heat transfer characteristic of a cooling device being placed near the heating element and cooling exhaust air from the heating element;

input refrigerant information of a refrigerant used in the cooling device, and power consumption of the heating element;

calculate a heat extraction amount of the cooling device, by use of the input refrigerant information, and a cooling capacity of the refrigerant;

calculate an air volume of air supplied to the cooling device, by applying the heat extraction amount to air volume dependence of the heat extraction amount, being derived by use of air volume dependence of a difference temperature between a temperature of the refrigerant and a temperature of exhaust air from the heating element, and the heat transfer characteristic, the air volume dependence of the difference temperature being derived by use of the intake air temperature, the power consumption, and the refrigerant information; and output data relating to the calculated air volume.

2. The management device according to claim 1, wherein the at least one processor is configured to execute the instruction to acquire, as the refrigerant information, a supplied refrigerant temperature being a temperature of the refrigerant supplied to the cooling device, a supplied refrigerant flow volume being a flow volume of the refrigerant supplied to the cooling device, a discharged refrigerant temperature being a temperature of the refrigerant discharged from the cooling device, and discharged refrigerant pressure being pressure of the refrigerant discharged from the cooling device.

3. The management device according to claim 2, wherein the at least one processor is configured to execute the instruction to calculate the heat extraction amount by use of the cooling capacity derived by applying the supplied refrigerant temperature, the discharged refrigerant temperature, and the discharged refrigerant pressure to a relation between a heat amount and pressure of the refrigerant.

4. The management device according to claim 2, wherein the at least one processor is configured to execute the instruction to drive, in relation to a Mollier diagram indicating a relation between a heat amount and pressure of the refrigerant, as the cooling capacity, a difference between a first specific enthalpy at an intersection point of an isothermal line after inflation of supercooled liquid based on the supplied refrigerant temperature and an isobaric line of heating steam based on the discharged refrigerant pressure, and a second specific enthalpy at an intersection point of an isothermal line of heating steam based on the discharged refrigerant temperature and the isobaric line.

5. The management device according to claim 2, wherein the at least one processor is configured to execute the instruction to calculate the heat extraction amount by integrating the cooling capacity of the cooling device with flux of the refrigerant.

6. The management device according to claim 2, wherein the at least one processor is configured to execute the instruction to store, as the heat transfer characteristic, a characteristic associating an air volume of air supplied to the cooling device with thermal conductance of the cooling device.

7. The management device according claim 2, wherein the at least one processor is configured to execute the instruction to use, as air volume dependence of the difference temperature, a characteristic associating an air volume of air supplied to the cooling device with a difference between an exhaust air temperature of the heating element and the supplied refrigerant temperature.

8. The management device according to claim 7, wherein the at least one processor is configured to execute the instruction to derive the exhaust air temperature of the heating element by applying the calculated air volume to air volume dependence of the difference temperature, and calculate, as a temperature rise value, a difference between the exhaust air temperature and the intake air temperature.

9. The management device according to claim 8, wherein the at least one processor is configured to execute the instructions to:

control an air conditioning device which adjusts a temperature inside of a room where the heating element is disposed to the intake air temperature, based on the calculated temperature rise value.

10. The management device according to claim 9, wherein the at least one processor is configured to execute the instructions to:

store a set air volume of the air conditioning device, refer to the set air volume, and generates a control signal for controlling the air conditioning device, based on the temperature rise value, and transmit the generated control signal to the air conditioning device.

11. The management device according to claim 10, wherein, in a system where at least one first heating element in which the cooling device is placed and at least one second heating element in which the cooling device is not placed are provided together, and the at least one processor is configured to execute the instructions to:

acquire the exhaust air temperature of the second heating element, calculate, in relation to the first heating element, as the temperature rise value, a difference between the exhaust air temperature and the intake air temperature, the exhaust air temperature being calculated by applying the calculated air volume to air volume dependence of the difference temperature, and calculate, in relation to the second heating element, as the temperature rise value, a difference between the exhaust air temperature of the acquired second heating element, and the intake air temperature, and set an air volume of the air conditioning device, based on the temperature rise value calculated in relation to at least either one of the first heating element or the second heating element.

12. The management device according to claim 11, wherein the at least one processor is configured to execute the instructions to:

store a predetermined temperature difference, and control the air conditioning device, based on a relation between the temperature rise value calculated in relation to at least either one of the first heating element or the second heating element, and the predetermined temperature difference.

13. The management device according to claim 12, wherein the at least one processor is configured to execute the instructions to:

increase an air volume of the air conditioning device when a maximum value of the temperature rise value calculated in relation to the first heating element and the second heating element is smaller than the predetermined temperature difference, and decrease an air volume of the air conditioning device when a maximum value of the temperature rise value calculated in relation to the first heating element and the second heating element is greater than the predetermined temperature difference.

14. The management device according to claim 12, further comprising
a display device which displays
display information including a display part which displays an air volume of air supplied to the cooling device, an input part for inputting an air volume to which the air conditioning device is set, and an execution button for setting the air conditioning device to an air volume input to the input part.

15. The management device according to claim 1, further comprising a display device which displays the output data.

16. A cooling system comprising:
at least one of the cooling devices; and
the management device according to claim 1.

17. A cooling system comprising:
at least one of the cooling devices;
the air conditioning device; and
the management device according to claim 9.

18. A management method comprising:
inputting refrigerant information of a refrigerant used in a cooling device, and power consumption of a heating element;
calculating a heat extraction amount by use of the input refrigerant information and a cooling capacity of the refrigerant;
deriving air volume dependence of the heat extraction amount of the cooling device by use of air volume dependence of a difference temperature between a temperature of the refrigerant and a temperature of exhaust air from the heating element, and a heat transfer characteristic of the cooling device, the air volume dependence of the difference temperature being derived by use of a known intake air temperature of the heating element, the power consumption, and the refrigerant information, the cooling device being placed near the heating element and cooling exhaust air from the heating element;
calculating an air volume of air supplied to the cooling device by applying the heat extraction amount to derived air volume dependence of the heat extraction amount; and
outputting data relating to a calculated air volume.

19. A non-transient program recording medium recording a program which causes a computer to execute:
processing of inputting refrigerant information of a refrigerant used in a cooling device, and power consumption of a heating element;
processing of calculating a heat extraction amount by use of the input refrigerant information and a cooling capacity of the refrigerant;
processing of deriving air volume dependence of the heat extraction amount of the cooling device by use of air volume dependence of a difference temperature between a temperature of the refrigerant and a temperature of exhaust air from the heating element, and a heat transfer characteristic of the cooling device, the air volume dependence of the difference temperature being derived by use of a known intake air temperature of the heating element, the power consumption, and the refrigerant information, the cooling device being placed near the heating element and cooling exhaust air from the heating element;
processing of calculating an air volume of air supplied to the cooling device by applying the heat extraction amount to derived air volume dependence of the heat extraction amount; and
processing of outputting data relating to a calculated air volume.

* * * * *